(12) United States Patent
Furuichi

(10) Patent No.: US 10,892,216 B2
(45) Date of Patent: Jan. 12, 2021

(54) WIRING SUBSTRATE AND SEMICONDUCTOR DEVICE

(71) Applicant: SHINKO ELECTRIC INDUSTRIES CO., LTD., Nagano (JP)

(72) Inventor: Jun Furuichi, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 16/390,684

(22) Filed: Apr. 22, 2019

(65) Prior Publication Data
US 2019/0333849 A1 Oct. 31, 2019

(30) Foreign Application Priority Data
Apr. 27, 2018 (JP) .................................. 2018-087608

(51) Int. Cl.
| | |
|---|---|
| H01L 23/498 | (2006.01) |
| H01L 23/13 | (2006.01) |
| H01L 23/29 | (2006.01) |
| H01L 23/538 | (2006.01) |
| H01L 25/065 | (2006.01) |

(Continued)

(52) U.S. Cl.
CPC ...... H01L 23/49838 (2013.01); H01L 21/486 (2013.01); H01L 21/4853 (2013.01); H01L 21/4857 (2013.01); H01L 21/6835 (2013.01); H01L 23/13 (2013.01); H01L 23/49816 (2013.01); H01L 23/49822 (2013.01); H01L 23/49866 (2013.01); H01L 24/16 (2013.01); H01L 24/32 (2013.01); H01L 24/73 (2013.01); H01L 2221/68345 (2013.01); H01L 2221/68359 (2013.01); H01L 2221/68372 (2013.01); H01L 2224/16227 (2013.01); H01L 2224/32225 (2013.01); H01L 2224/73204 (2013.01); H01L 2924/35121 (2013.01)

(58) Field of Classification Search
CPC ......................... H01L 23/13; H01L 23/49816
See application file for complete search history.

(56) References Cited

U.S. PATENT DOCUMENTS

| | | | | |
|---|---|---|---|---|
| 2004/0238927 | A1* | 12/2004 | Miyazawa | .......... H01L 25/0657 257/678 |
| 2010/0038800 | A1* | 2/2010 | Yoon | ....................... H01L 24/16 257/774 |

(Continued)

FOREIGN PATENT DOCUMENTS

JP 2017-157666 9/2017

*Primary Examiner* — Omar F Mojaddedi
(74) *Attorney, Agent, or Firm* — Rankin, Hill & Clark LLP

(57) ABSTRACT

A first insulation layer includes a concave portion formed in a lower surface thereof. A first wiring layer is formed in the concave portion. A protective insulation layer has an opening configured to expose a part of the first wiring layer and is stacked on the lower surface of the first insulation layer. An adhesion layer is interposed between the first wiring layer and the protective insulation layer and has higher adhesiveness with the protective insulation layer than the first wiring layer. The first wiring layer includes a pad portion formed in the concave portion and a protrusion protruding from a portion of a lower surface of the pad portion into the opening. The adhesion layer is formed to cover the lower surface of the pad portion and a side surface of the protrusion and to expose a lower end face of the protrusion.

11 Claims, 12 Drawing Sheets

(51) Int. Cl.
*H01L 23/48* (2006.01)
*H01L 21/48* (2006.01)
*H01L 21/683* (2006.01)
*H01L 23/00* (2006.01)

(56) References Cited

U.S. PATENT DOCUMENTS

| | | | |
|---|---|---|---|
| 2011/0092065 A1* | 4/2011 | Yoshida | H01L 23/481 438/613 |
| 2016/0233167 A1* | 8/2016 | Shimizu | H01L 23/5383 |
| 2017/0256482 A1 | 9/2017 | Furuichi et al. | |

* cited by examiner

WIRING SUBSTRATE AND SEMICONDUCTOR DEVICE

CROSS-REFERENCE TO RELATED APPLICATION

The present application claims priority under 35 USC 119 from Japanese Patent Application No. 2018-087608 filed on Apr. 27, 2018.

TECHNICAL FIELD

The present disclosure relates to a wiring substrate and a semiconductor device.

RELATED ART

As regards a wiring substrate for mounting an electronic component such as a semiconductor chip, a variety of shapes and structures have been suggested. In recent years, a wiring has been also required to be fine on the wiring substrate on which the semiconductor chip is to be mounted, in association with high integration and high functionality of the semiconductor chip.

In the related art, a wiring substrate has been suggested in which a wiring pattern is made to protrude from an insulation layer of an outermost layer, a protective insulation layer such as a solder resist layer is formed on the insulation layer of the outermost layer so as to cover the wiring pattern and the wiring pattern exposed from the protective insulation layer is formed as a connection pad (for example, refer to Patent Document 1).

Patent Document 1: JP-A-2017-157666

In the wiring substrate of the related art, when the wiring pattern is formed of copper or copper alloy, adhesiveness between the wiring pattern and the protective insulation layer is not favorable. For this reason, for example, when bending or thermal stress occurs in the wiring substrate, the protective insulation layer is likely to be peeled off from the wiring pattern.

SUMMARY OF INVENTION

Aspect of non-limiting embodiments of the present disclosure relates to provide a wiring substrate and a semiconductor device.

Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

According to an aspect of the present disclosure, there is provided a wiring substrate comprising:

a first insulation layer including a concave portion formed in a lower surface of the first insulation layer;

a first wiring layer formed in the concave portion;

a protective insulation layer having an opening configured to expose a part of the first wiring layer and stacked on the lower surface of the first insulation layer, and an adhesion layer interposed between the first wiring layer and the protective insulation layer and having higher adhesiveness with the protective insulation layer than the first wiring layer, wherein the first wiring layer is formed on an upper surface of the protective insulation layer with the adhesion layer being interposed therebetween, and comprises a pad portion formed in the concave portion and a protrusion protruding from a portion of a lower surface of the pad portion into the opening, and wherein the adhesion layer is formed to cover the lower surface of the pad portion and a side surface of the protrusion and to expose a lower end face of the protrusion.

According to one aspect of the present disclosure, it is possible to suppress the protective insulation layer from being peeled off.

BRIEF DESCRIPTION OF DRAWINGS

Exemplary embodiments of the present invention will be described in detail based on the following figures, wherein.

DESCRIPTION OF EMBODIMENTS

Hereinafter, an exemplary embodiment will be described with reference to the accompanying drawings. For convenience sake, the accompanying drawings may show an enlarged view of a portion that is a feature, so as to easily understand the feature. Also, the drawings do not always show a real dimensional ration of respective constitutional elements, and the like. Also, in a sectional view, hatching of some members are shown with a satin pattern and hatching of some members are omitted so as to easily understand a sectional structure of each member.

First, a structure of a wiring substrate 10 is described with reference to FIG. 1.

Figure 1A:
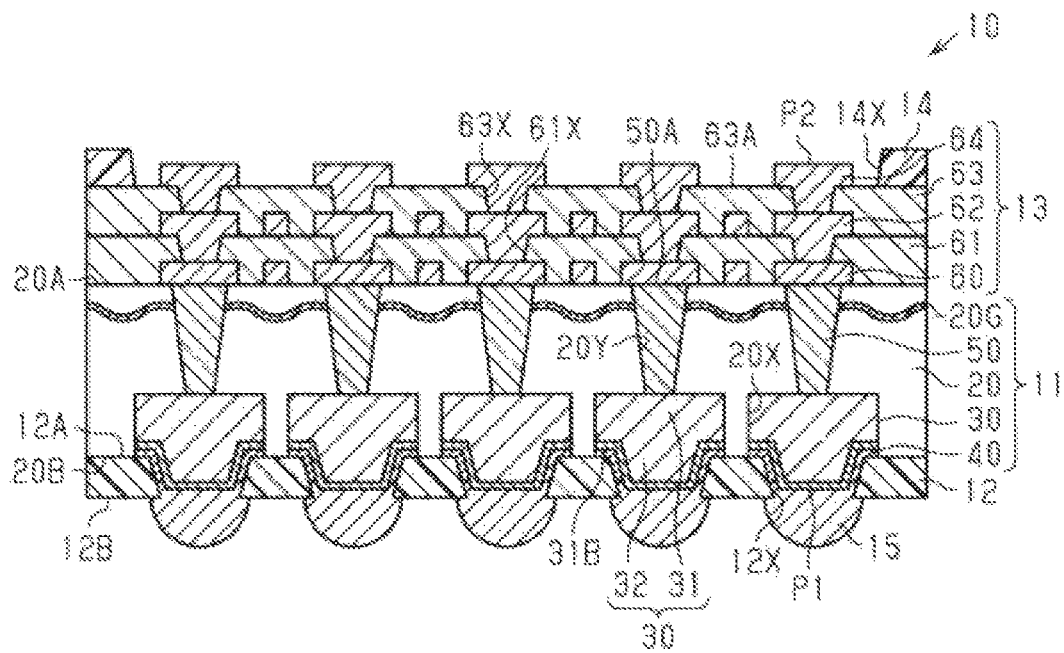
FIG. 1A is a schematic sectional view depicting a wiring substrate of an exemplary embodiment.

As shown in FIG. 1A, the wiring substrate 10 includes a wiring structure 11, a solder resist layer 12 stacked at a lower side of the wiring structure 11, a wiring structure 13 stacked at an upper side of the wiring structure 11, a solder resist layer 14 stacked at an upper side of the wiring structure 13, and external connection terminals 15.

First, a structure of the wiring structure 11 is described.

The wiring structure 11 is a low-density wiring layer in which a wiring layer having a wiring density lower than the wiring structure 13 is formed. The wiring structure 11 includes an insulation layer 20 of one layer, a wiring layer 30, an adhesion layer 40, and via-wirings 50 penetrating the insulation layer 20 in a thickness direction.

Here, as a material of the insulation layer 20, for example, an insulating resin in which a reinforcement material is mixed in a thermosetting resin may be used. For example, as a material of the insulation layer 20, a so-called glass epoxy resin in which a thermosetting insulating resin having an epoxy resin as a main component is impregnated and cured in glass cloth (glass woven fabric), which is a reinforcement material, may be used. The reinforcement material is not limited to the glass cloth. For example, glass non-woven fabric, aramid woven fabric, aramid non-woven fabric, liquid crystal polymer (LCP) woven fabric or LCP non-woven fabric may be used. The thermosetting insulating resin is not limited to the epoxy resin. For example, an insulating resin such as a polyimide resin and a cyanate resin may be used. The insulation layer 20 may contain a filler such as silica and alumina, for example.

The insulation layer 20 has a predetermined number (one, here) of glass cloth 20G. The glass cloth 20G is unevenly distributed at the wiring structure 13-side (upper side) of a center of the insulation layer 20 in the thickness direction in the insulation layer 20, for example. Specifically, a center of the glass cloth 20G in the thickness direction is located at a position closer to the wiring structure 13 than the center of the insulation layer 20 in the thickness direction. However, in the exemplary embodiment, the glass cloth 20G is not exposed to an upper surface 20A of the insulation layer 20.

A lower surface 20B of the insulation layer 20 is formed with a plurality of concave portions 20X, which are concave toward the upper surface 20A of the insulation layer 20, at desired places. Each of the concave portions 20X is formed from the lower surface 20B of the insulation layer 20 to a part of the insulation layer 20 in the thickness direction. That is, each of the concave portions 20X is formed so that a bottom surface thereof is located at a part of the insulation layer 20 in the thickness direction. A depth of the concave portion 20X may be set to about 12 to 20 µm, for example. A planar shape of the concave portion 20X may be configured to have any shape and any size. For example, the planar shape of the concave portion 20X may be formed to have a circular shape having a diameter of about 150 to 300 µm.

In the specification, the description "as seen from above" indicates that a target object is seen in a normal direction of a lower surface 12B of the solder resist layer 12, and "planar shape" indicates a shape as seen from the normal direction of the lower surface 12B of the solder resist layer 12.

In each of the concave portions 20X, a wiring layer 30 is formed. The wiring layer 30 is formed in the concave portions 20X so as to protrude downward beyond the lower surface 20B of the insulation layer 20. The wiring layer 30 has a substantially T-shaped section, for example. The wiring layer 30 has pad portions 31 formed in the concave portions 20X and protrusions 32 protruding downward from lower surfaces 31B of the pad portions 31. The pad portions 31 and the protrusions 32 are integrally formed.

In the meantime, a line and space (L/S) of the wiring layer 30 may be set to about 20 µm/20 µm, for example. Here, the line and space (L/S) indicates a wiring width and an interval between adjacent wirings. As a material of the wiring layer 30, copper or copper alloy may be used, for example.

On the lower surface 20B of the insulation layer 20, a solder resist layer 12 having openings 12X for exposing portions of the wiring layer 30 of the lowest layer as pads P1 for external connection is stacked. The solder resist layer 12 is a protective insulation layer formed on the outermost layer (here, the lowest layer) of the wiring substrate 10. The pads P1 for external connection are connected with the external connection terminals 15 such as solder bumps and lead pins that are to be used when mounting the wiring substrate 10 to a mounting substrate such as a motherboard. In the meantime, as a material of the solder resist layer 12, a photosensitive insulating resin of which a main component is a phenol-based resin, a polyimide-based resin or the like may be used, for example. Also, as a material of the solder resist layer 12, for example, a photosensitive insulating resin of which a main component is a silicone-based resin, an epoxy-based resin, a cycloolefin-based resin, a benzocyclobutene-based resin or the like may be used. The solder resist layer 12 may contain a filler such as silica, alumina and the like, for example.

The opening 12X is formed to penetrate the solder resist layer 12 in the thickness direction. The opening 12X has a tapered shape where an opening width decreases from the upper surface 12A-side of the solder resist layer 12 (an upper side in FIG. 1A) toward the lower surface 12B-side of the solder resist layer 12 (a lower side in FIG. 1A). In the exemplary embodiment, the opening 12X has a conical shape where a diameter of a lower opening end is smaller than a diameter of an upper opening end, for example. The opening 12X and the pad P1 for external connection may be formed to have a planar shape of any shape and any size, respectively. For example, the planar shape of the opening 12X may be a circular shape having a diameter of about 100 to 150 µm. The planar shape of the pad P1 for external connection is formed smaller than the planar shape of the opening 12X by one dimension.

Figure 1B:
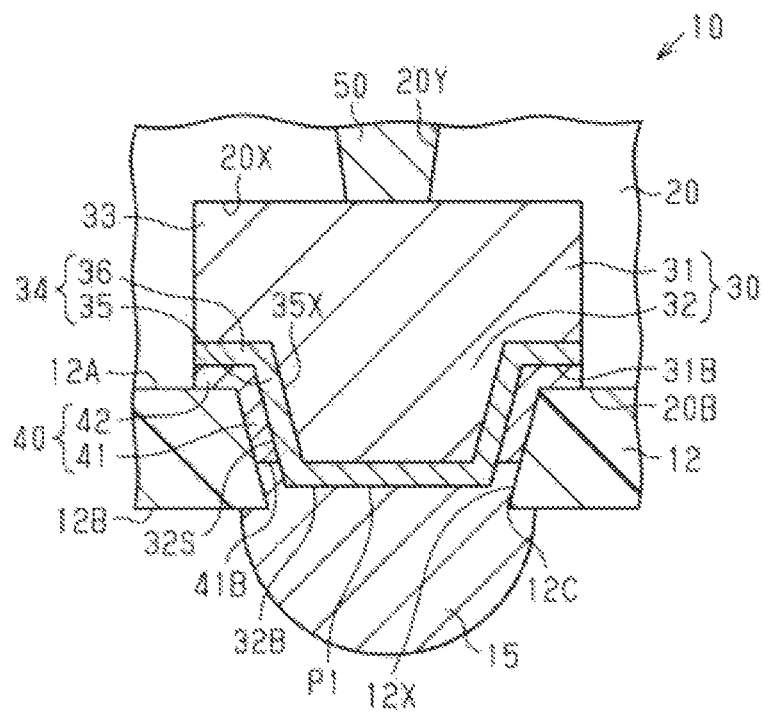
FIG. 1B is an enlarged sectional view of a part of the wiring substrate shown in FIG. 1A.

As shown in FIG. 1B, the adhesion layer 40 is interposed between the solder resist layer 12 and the wiring layer 30. The adhesion layer 40 is formed to cover the lower surface 31B of the pad portion 31 and side surfaces 32S of the protrusion 32 and to expose a lower end face 32B of the protrusion 32. As a material of the adhesion layer 40, a metal material having higher adhesiveness with the solder resist layer 12 than the metal material (for example, copper) of the wiring layer 30 is used. As a material of the adhesion layer 40, for example, metal such as titanium (Ti), titanium nitride (TiN), tantalum nitride (TaN), tantalum (Ta), nickel (Ni), chromium (Cr) and the like, or an alloy including at least one selected from the metals may be used. The adhesion layer 40 formed of the material functions as a metal barrier layer for suppressing diffusion of copper from the wiring layer 30 (for example, Cu layer) to the solder resist layer 12 and the like, too, for example. In the meantime, as the adhesion layer 40, for example, a metal film (sputtered film) formed by a spatter method may be used.

Subsequently, structures of the wiring layer 30, the adhesion layer 40, the solder resist layer 12 and the external connection terminal 15 are described in detail with reference to FIG. 1B.

The pad portion 31 is formed on a bottom surface of the concave portion 20X. The pad portion 31 is formed to fill a part (an upper part) of the concave portion 20X. A planar shape of the pad portion 31 is the same as the planar shape of the concave portion 20X (for example, a circular shape). The planar shape of the pad portion 31 is formed to be larger than a planar shape of the protrusion 32. For example, the pad portion 31 is formed to have a diameter larger than the protrusion 32. A thickness of the pad portion 31 is formed shallower than a depth of the concave portion 20X. Specifically, the thickness of the pad portion 31 is formed shallower than the depth of the concave portion 20X by a thickness of the adhesion layer 40. The pad portion 31 is formed to have a pillar shape (for example, a circular cylinder shape) of which an upper surface and the lower surface 31B have substantially the same sizes, for example.

The protrusion 32 is formed to have a pillar shape extending downward from a part of the lower surface 31B of the pad portion 31, and a part thereof is provided in the opening 12X of the solder resist layer 12. In other words, a lower part of the protrusion 32 is formed to protrude more downward than the lower surface 20B of the insulation layer 20. An upper part of the protrusion 32 is arranged in the concave portion 20X, and the lower part of the protrusions 32 is arranged in the opening 12X. Specifically, in the exemplary embodiment, the protrusion 32 is mostly arranged in the opening 12X, and is arranged in the concave portion 20X from an upper end of the protrusion 32 by the thickness of the adhesion layer 40.

The protrusion 32 has a tapered shape where a width decreases from an upper side (the pad portion 31-side) toward a lower side in FIG. 1B. In the exemplary embodiment, the protrusion 32 is formed to have a substantially inverted conical shape where the lower end face 32B has a diameter smaller than an upper surface, for example. The protrusion 32 has a shape conforming to an inner surface of the opening 12X. For example, the side surface 32S of the protrusion 32 is formed to be inclined along an inclination of the inner surface of the opening 12X. The protrusion 32 is formed smaller than the opening 12X by one dimension. The lower end face 32B of the protrusion 32 is entirely exposed from the solder resist layer 12. The lower end face 32B of the protrusion 32 exposed from the solder resist layer 12 functions as the pad P1 for external connection. The lower end face 32B of the protrusion 32 is provided to be located at a position higher than the lower surface 12B of the solder resist layer 12. For example, the lower end face 32B of the protrusion 32 is provided to be located at a position that is higher than the lower surface 12B of the solder resist layer 12 by the thickness of the adhesion layer 40. In other words, the protrusion 32 does not protrude downward beyond the lower surface 12B of the solder resist layer 12. The protrusion 32 is more concave upward than the lower surface 12B of the solder resist layer 12. A height of the protrusion 32 may be set to about 12 to 20 μm, for example. A diameter of the lower end face 32B of the protrusion 32 may be set to about 80 to 120 μm, for example.

The pad portion 31 and the protrusion 32 (the wiring layer 30) have a structure where a metal layer 33 and a seed layer 34 formed on a lower surface of the metal layer 33 are stacked. As the metal layer 33, for example, a metal layer (electrolytically plated metal layer) formed by an electrolytic plating method may be used. As the seed layer 34, for example, a metal film (sputtered film) formed by a sputter method may be used. In the meantime, as materials of the metal layer 33 and the seed layer 34, for example, copper or copper alloy may be used.

The metal layer 33 is formed to have a T-shaped section, similarly to the entire structure of the wiring layer 30, for example. The seed layer 34 is formed to cover an entire lower surface of the metal layer 33. Specifically, the seed layer 34 is formed to continuously cover a lower surface of the metal layer 33 configuring the pad portion 31 and a side surface and a lower surface of the metal layer 33 configuring the protrusion 32. The seed layer 34 is formed to have a hollow hat shape, for example. Specifically, the seed layer 34 has a main body portion 35 having a U-shaped section and a collar portion 36 protruding outward (laterally) from an end portion of the main body portion 35. The main body portion 35 is formed with a concave portion 35X extending downward from the collar portion 36 toward the lower surface 12B of the solder resist layer 12. In the concave portion 35X, the metal layer 33 configuring the protrusion 32 is filled. Also, the lower end face 32B of the protrusion 32 is configured by a lower surface of the main body portion 35.

The collar portion 36 is arranged in the concave portion 20X. The collar portion 36 is formed to cover the lower surface of the metal layer 33 configuring the pad portion 31. A side surface of the collar portion 36 is formed to be substantially flush with the side surface of the metal layer 33 configuring the pad portion 31, for example.

The adhesion layer 40 is formed to be in contact with the lower surface 31B of the pad portion 31 and the side surface 32S of the protrusion 32, and to continuously cover the lower surface 31B of the pad portion 31 and the side surface 32S of the protrusion 32. Also, the adhesion layer 40 is formed to be in contact with the inner surface of the opening 12X of the solder resist layer 12 and the upper surface 12A of the solder resist layer 12 and to continuously cover the inner surface of the opening 12X and the upper surface 12A of the solder resist layer 12. That is, the adhesion layer 40 is interposed between the upper surface 12A of the solder resist layer 12 and the lower surface 31B of the pad portion 31 and between the inner surface of the opening 12X and the side surface 32S of the protrusion 32. In other words, the pad portion 31 is formed on the upper surface 12A of the solder resist layer 12 with the adhesion layer 40 being interposed therebetween, and the protrusion 32 is formed in the opening 12X with the adhesion layer 40 being interposed therebetween. In this way, in the wiring substrate 10, the adhesion layer 40 is interposed between the solder resist layer 12 and the wiring layer 30 (the pad portion 31 and the protrusion 32), so that the solder resist layer 12 and the wiring layer 30 do not contact directly each other.

The adhesion layer 40 has a cylindrical portion 41 configured to cover the side surface 32S of the protrusion 32 over an entire circumference and to expose the lower end face 32B of the protrusion 32, and a collar portion 42 protruding outward (laterally) from an upper end portion of the cylindrical portion 41. The cylindrical portion 41 is arranged in the opening 12X. The cylindrical portion 41 is formed to extend more downward than the lower surface 20B of the insulation layer 20. The cylindrical portion 41 is formed along the side surface 32S of the protrusion 32 and along the inner surface of the opening 12X. To this end, the cylindrical portion 41 has a tapered shape where a width decreases from an upper side toward a lower side in FIG. 1B.

A lower end face 41B of the cylindrical portion 41 is exposed to the opening 12X of the solder resist layer 12. The lower end face 41B of the cylindrical portion 41 is formed to be more concave upward than the lower end face 32B of the protrusion 32. That is, the adhesion layer 40 is formed to expose a part of the side surface 32S of the protrusion 32 (specifically, the side surface 32S of the lower end portion of the protrusion 32).

The collar portion 42 is arranged in the concave portion 20X. The collar portion 42 is formed to cover the entire lower surface 31B of the pad portion 31 (specifically, the entire lower surface of the collar portion 36 of the seed layer 34), for example. A side surface of the collar portion 42 is formed to be substantially flush with the side surface of the metal layer 33 configuring the pad portion 31 and the side surface of the collar portion 36, for example.

In the opening 12X of the solder resist layer 12, the lower end face 32B of the protrusion 32 is exposed as the pad P1 for external connection and a part of the side surface 32S of the protrusion 32 is exposed.

In the meantime, as needed, a surface-treated layer may be formed on the surface (the lower end face 32B and the side surface 32S or only the lower end face 32B) of the protrusion 32 exposed from the adhesion layer 40. As the surface-treated layer, a gold (Au) layer, a nickel (Ni) layer/Au layer (a metal layer having a Ni layer and an Au layer stacked in corresponding order), a Ni layer/palladium (Pd) layer/Au layer (a metal layer having a Ni layer, a Pd layer and an Au layer stacked in corresponding order), and the like may be exemplified. As the Ni layer, the Au layer, and the Pd layer, for example, a metal layer (electrolessly plated metal layer) formed by an electroless plating method may be used. Also, the Au layer is a metal layer formed of Au or Au alloy, the Ni layer is a metal layer formed of Ni or Ni alloy, and the Pd layer is a metal layer formed of Pd or Pd alloy. Also, as the surface-treated layer, an OSP (Organic Solderability Preservative) film formed on the surface (the lower end face 32B and the side surface 32S or only the lower end face 32B) of the protrusion 32 exposed from the adhesion layer 40 by implementing antioxidant processing such as OSP processing may be used. As the OSP film, an organic film of azole compound or imidazole compound may be used.

On the pad P1 for external connection, the external connection terminal 15 is formed. The external connection terminal 15 is a connection terminal to be electrically connected to a pad provided on a mounting substrate (not shown) such as a motherboard, for example. As the external connection terminal 15, for example, a solder bump or a lead pin may be used. In the exemplary embodiment, as the external connection terminal 15, the solder bump is used.

The external connection terminal 15 is formed to cover the entire lower end face 32B (the pad for external connection) of the protrusion 32. The external connection terminal 15 is formed to enter the opening 12X. The external connection terminal 15 is formed to fill the opening 12X exposed from the protrusion 32 and the adhesion layer 40. For example, the external connection terminal 15 is formed to cover the lower end face 41B of the adhesion layer 40 and the side surface 32S of the protrusion 32 exposed from the adhesion layer 40.

In the exemplary embodiment, the external connection terminal 15 is formed to cover the inner surface of the opening 12X exposed from the adhesion layer 40 and to cover the lower surface 12B of the solder resist layer 12 located at a peripheral edge of the opening 12X. At this time, in the exemplary embodiment, the opening 12X of the solder resist layer 12 has a tapered shape where an opening width decreases from the upper side toward the lower side. For this reason, a corner portion 12C of the solder resist layer 12, which is a lower opening end of the opening 12X, is formed so that an angle between the lower surface 12B of the solder resist layer 12 and the inner surface of the opening 12X is to be an acute angle, and is formed to overlap a part of the adhesion layer 40, as seen from above. Therefore, in the exemplary embodiment, the external connection terminal 15 is formed to be bitten by the corner portion 12C of the solder resist layer 12. In other words, the corner portion 12C of the solder resist layer 12 is formed to bite into the external connection terminals 15.

As shown in FIG. 1A, the insulation layer 20 is formed with through-holes 20Y opening to desired places of the upper surface 20A and penetrating the insulation layer 20 in the thickness direction to expose portions of an upper surface of the wiring layer 30. The through-hole 20Y has a tapered shape where a diameter decrease from the upper side (the wiling structure 13-side) toward the lower side (the wiring layer 30-side), in FIG. 1A. For example, the through-hole 20Y has a substantially inverted conical shape where an opening diameter of a lower opening end is smaller than an opening diameter of an upper opening end. For example, the opening diameter of the upper opening end of the through-hole 20Y may be set to about 50 to 100 μm.

The upper surface 20A of the insulation layer 20 is a smooth surface having small unevenness (a surface having a low degree of roughness). For example, the upper surface 20A of the insulation layer 20 is a polished surface. The upper surface 20A of the insulation layer 20 has a surface roughness smaller than an inner surface of the through-hole 20Y, for example. The degree of roughness of the upper surface 20A of the insulation layer 20 is set to about 15 to 40 nm, which is a value of the surface roughness Ra, for example. Also, the degree of roughness of the inner surface of the through-hole 20Y is set to about 300 to 400 nm, which is a value of the surface roughness Ra, for example. Here, the value of the surface roughness Ra is a kind of a numerical value indicative of the surface roughness, is referred to as an arithmetic average roughness, and is an arithmetic average value obtained by measuring absolute values of a height changing in a measurement region from a surface, which is an average line.

In the through-hole 20Y, the via-wiring 50 connected to the wiring layer 30 is formed. The via-wiring 50 is formed to penetrate the insulation layer 20 in the thickness direction. In the exemplary embodiment, the via-wiring 50 is filled in the through-hole 20Y. For this reason, the via-wiring 50 has a substantially inverted conical shape where a lower end face is smaller than an upper end face 50A, like the through-hole 20Y.

The upper end face 50A of the via-wiring 50 is exposed from the upper surface 20A of the insulation layer 20. For example, the upper end face 50A of the via-wiring 50 is formed to be substantially flush with the upper surface 20A of the insulation layer 20. The upper end face 50A of the via-wiring 50 is a smooth surface having small unevenness (a surface having a low degree of roughness), like the upper surface 20A of the insulation layer 20. For example, the upper end face 50A of the via-wiring 50 is a polished surface. The degree of roughness of the upper end face 50A of the via-wiring 50 is set to about 15 to 40 nm, which is a value of the surface roughness Ra, for example.

The lower end face of the via-wiring 50 is directly connected to a part of the upper surface of the wiring layer 30. That is, a part of the upper surface of the wiring layer 30 and the lower end face of the via-wiring 50 are in contact with each other, so that the wiring layer 30 and the via-wiring 50 are electrically interconnected. In other words, the wiring layer 30 and the via-wiring 50 are electrically connected but are separately formed, other than being integrally formed. In the meantime, as a material of the via-wiring 50, copper or copper alloy may be used, for example.

Subsequently, a structure of the wiring structure 13 is described with reference to FIG. 1A.

The wiring structure 13 is a wiring structure stacked on the upper surface 20A of the insulation layer 20. The wiring structure 13 is a high-density wiring layer in which a wiring layer having a wiring density higher than the wiring structure 11 is formed.

The wiring structure 13 has such a structure that a wiring layer 60 stacked on the upper surface 20A of the insulation layer 20, an insulation layer 61, a wiring layer 62, an insulation layer 63, and a wiring layer 64 are stacked in corresponding order.

Here, as a material of the insulation layers 61, 63, for example, an insulating resin of which a main component is a photosensitive resin such as a phenol-based resin, a polyimide-based resin and the like may be used. The insulation layers 61, 63 may contain a filler such as silica and alumina, for example. Also, as a material of the wiring layers 60, 62, 64, for example, copper or copper alloy may be used.

The insulation layers 61, 63 are insulation layers thinner than the insulation layer 20 in the wiring structure 11. A thickness of each of the insulation layers 61, 63 may be set to about 3 to 10 μm, for example. The wiring layers 60, 62, 64 are wiring layers thinner than the wiring layer 30 of the wiring structure 11. A thickness of each of the wiring layers 60, 62 formed on the insulation layers 20, 61 may be set to about 1 to 5 μm, for example. A thickness of the wiring layer 64 formed on the insulation layer 63 may be set to about 5 to 10 μm, for example. A wiring width and a wiring interval of each of the wiring layers 60, 62, 64 are smaller than a wiring width and a wiring interval of the wiring layer 30 in the wiring structure 11. A line and space (L/S) of each of the wiring layers 60, 62, 64 may be set to about 2 μm/2 μm to 3 μm/3 μm, for example.

The wiring layer 60 is stacked on the upper surface 20A of the insulation layer 20 so as to connect to the upper end faces 50A of the via-wirings 50. That is, portions of a lower surface of the wiring layer 60 are in contact with the upper end faces 50A of the via-wirings 50, so that the wiring layer 60 and the via-wirings 50 are electrically interconnected. In other words, the wiring layer 60 and the via-wirings 50 are electrically connected but are not integrally formed.

The insulation layer 61 is formed on the upper surface 20A of the insulation layer 20 so as to cover the wiring layer 60. The insulation layer 61 is formed at desired places with through-holes 61X penetrating the insulation layer 61 in the thickness direction and configured to expose portions of the upper surface of the wiring layer 60.

The wiring layer 62 is stacked on an upper surface of the insulation layer 61. The wiring layer 62 is electrically connected to the wiring layer 60. The wiring layer 62 includes via-wirings filled in the through-holes 61X and a wiring pattern formed on the upper surface of the insulation layer 61.

The insulation layer 63 is formed on the upper surface of the insulation layer 61 so as to cover the wiring layer 62. The insulation layer 63 is formed at desired places with through-holes 63X penetrating the insulation layer 63 in the thickness direction and configured to expose portions of an upper surface of the wiring layer 62.

Here, the through-holes 61X, 63X have a tapered shape where a diameter decreases from the upper side (the wiring layer 64-side) toward the lower side (the wiring structure 11-side) in FIG. 1A, respectively. For example, the through-holes 61X, 63X have a substantially inverted conical shape where an opening diameter of an upper opening end is larger than an opening diameter of a lower opening end, respectively. The opening diameter of the upper opening end of each of the through-holes 61X, 63X may be set to about 5 to 10 μm, for example.

The wiring layer 64 is formed on an upper surface 63A of the insulation layer 63. The wiring layer 64 is electrically connected to the wiring layer 62. The wiring layer 64 includes via-wirings filled in the through-holes 63X and connection terminals P2 protruding upward from the upper surface 63A of the insulation layer 63. The connection terminal P2 is a pillar-shaped connection terminal (metal post) extending upward from the upper surface 63A of the insulation layer 63, for example. The connection terminal P2 may be formed to have a planar shape of any shape and any size. For example, the planar shape of the connection terminal P2 may be formed to have a circular shape having a diameter of about 20 to 25 μm. A pitch of the connection terminals P2 may be set to about 40 to 50 μm, for example. The connection terminal P2 functions as a pad for electronic component mount for electrical connection with an electronic component such as a semiconductor chip.

In the meantime, as needed, a surface-treated layer may be formed on the surface (the upper surface and the side surface or only the upper surface) of the connection terminal P2. As the surface-treated layer, an Au layer, a Ni layer/Au layer, a Ni layer/Pd layer/Au layer, an OSP film and the like may be exemplified.

The solder resist layer 14 is stacked on the upper surface 63A of the insulation layer 63, which is a top layer of the wiring structure 13. The solder resist layer 14 is a protective insulation layer formed on the outermost layer (a top layer, here) of the wiring substrate 10.

The solder resist layer 14 has a frame shape to surround a chip mounting region in which the semiconductor chip 71 (refer to FIG. 2) is to be mounted. In other words, the solder resist layer 14 is formed with openings 14X configured to expose the wiring layer 64 and the insulation layer 63 located in the chip mounting region.

As a material of the solder resist layer 14, for example, a photosensitive insulating resin of which a main component is a phenol-based resin, a polyimide-based resin or the like may be used. Also, as a material of the solder resist layer 14, for example, a photosensitive insulating resin of which a main component is a silicone-based resin, an epoxy-based resin, a cycloolefin-based resin, a benzocyclobutene-based resin or the like may be used. The solder resist layer 14 may contain a filler such as silica and alumina, for example.

Figure 2:
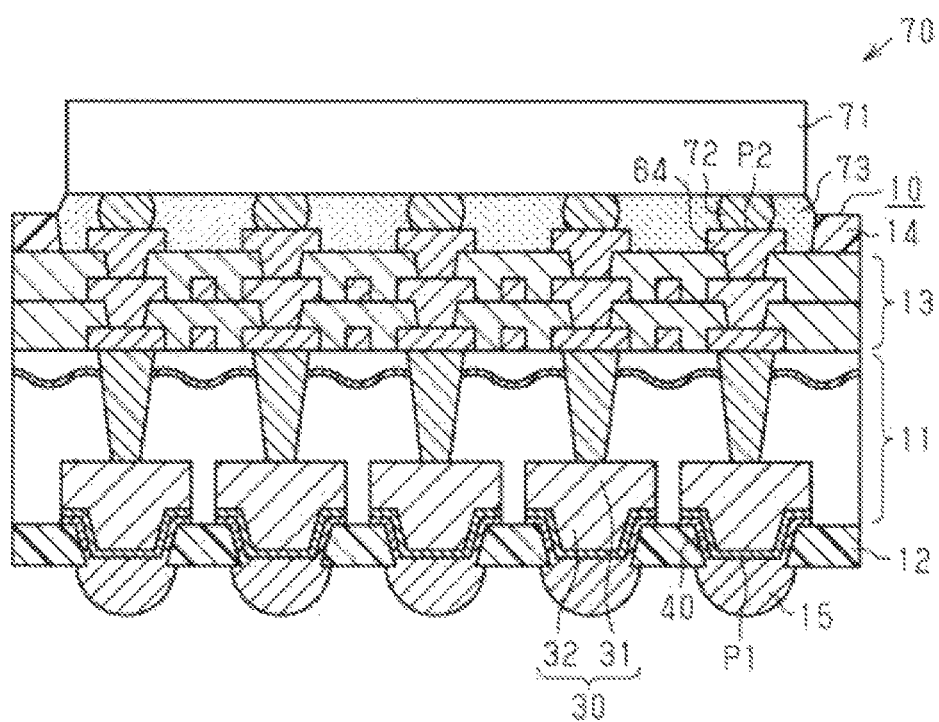
FIG. 2 is a schematic sectional view depicting a semiconductor device of the exemplary embodiment.

Subsequently, a structure of a semiconductor device 70 is described with reference to FIG. 2.

The semiconductor device 70 includes the wiring substrate 10, one or more semiconductor chips 71 and an under-fill resin 73.

The semiconductor chip 71 is flip chip-mounted on the wiring substrate 10. That is, bumps 72 arranged on a circuit formation surface (a lower surface, here) of the semiconductor chip 71 are bonded to the connection terminals P2 of the wiring substrate 10, so that the semiconductor chip 71 is electrically connected to the wiring layer 64, via the bumps 72.

As the semiconductor chip 71, for example, a logic chip such as a CPU (Central Processing Unit), a GPU (Graphics Processing Unit) chip and the like may be used. Also, as the semiconductor chip 71, for example, a memory chip such as a DRAM (Dynamic Random Access Memory) chip, an SRAM (Static Random Access Memory) chip, a flash memory chip and the like may be used. In the meantime, when mounting a plurality of semiconductor chips 71 on the wiring substrate 10, a combination of the logic chip and the memory chip may be mounted on the wiring substrate 10.

As the bump 72, for example, a gold bump or a solder bump may be used. As a material of the solder bump, for example, an alloy including lead (Ph), an alloy of tin (Sn) and Au, an alloy of Sn and Cu, an alloy of Sn and silver (Ag), an alloy of Sn, Ag and Cu and the like may be used.

The under-fill resin 73 is provided to fill a gap between the wiring substrate 10 and the semiconductor chip 71. As a material of the under-fill resin 73, for example, an insulating resin such as an epoxy-based resin may be used.

Subsequently, a manufacturing method of the wiring substrate 10 is described. In below descriptions, one wiring substrate 10 is described with being enlarged. However, actually, members becoming a plurality of the wiring substrates 10 are collectively manufactured on one substrate and are then divided into each wiring substrate 10. In the meantime, for convenience sake of descriptions, the parts to be finally the respective constitutional elements of the wiring substrate 10 are denoted with the reference numerals of the final constitutional elements.

Figure 3A:
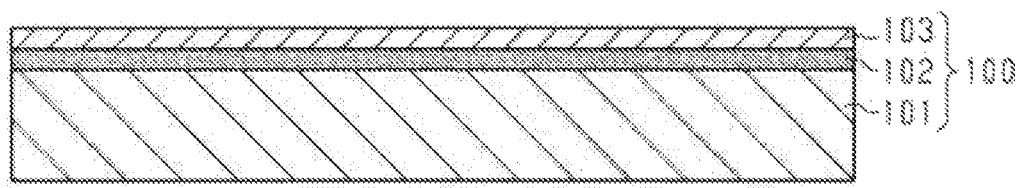
FIGS. 3A to 3D are schematic sectional views depicting a manufacturing method of the wiring substrate of the exemplary embodiment.

As shown in FIG. 3A, a support substrate 100 is prepared. As the support substrate 100, for example, a metal plate or a metal foil may be used. In the exemplary embodiment, the support substrate 100 includes a support body copper foil 101, and an extremely thin copper foil 103 bonded to an upper surface of the support body copper foil 101 via a release layer 102. A thickness of the support body copper foil 101 may be set to about 35 to 70 μm, for example. A thickness of the copper foil 103 may be set to about 2 to 5 μm, for example.

Figure 3B:
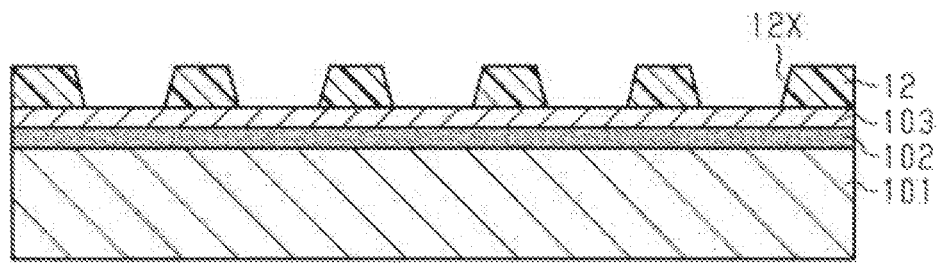

Subsequently, in a process of FIG. 3B, a solder resist layer 12 having openings 12X configured to expose portions of an upper surface of the copper foil 103 is formed on the copper foil 103. The solder resist layer 12 may be formed by laminating a photosensitive solder resist film or applying a liquid form solder resist and patterning the resist by a photolithography method, for example. In the exemplary embodiment, the opening 12X has a tapered shape where an opening width decreases from the upper side toward the lower side.

Figure 3C:
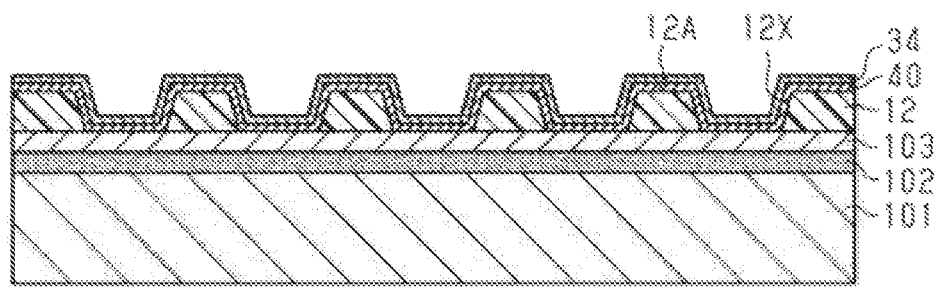

Then, in a process of FIG. 3C, an adhesion layer 40 is formed to cover an entire surface of the solder resist layer 12 including inner surfaces of the openings 12X (the inner surfaces of the openings 12X and the upper surface of the copper foil 103 exposed to the openings 12X). The adhesion layer 40 may be formed by a sputter method or a vapor deposition method, for example.

Subsequently, a seed layer 34 is formed on the adhesion layer 40. The seed layer 34 is formed to cover an entire upper surface of the adhesion layer 40, for example. The seed layer 34 may be formed by a sputter method, a vapor deposition method, an electrolytic plating method, or an electroless plating method.

For example, when forming the adhesion layer 40 and the seed layer 34 by the sputter method, titanium is first deposited on the entire surface of the solder resist layer 12 including the inner surfaces of the openings 12X so as to cover the entire surface by sputtering, so that the adhesion layer 40 (Ti layer) is formed. Then, copper is deposited on the adhesion layer 40 by sputtering, so that the seed layer 34 (Cu layer) is formed. At this time, the adhesion layer 40 and the seed layer 34 are formed along shapes of the inner surfaces of the openings 12X and the upper surface 12A of the solder resist layer 12.

Figure 3D:
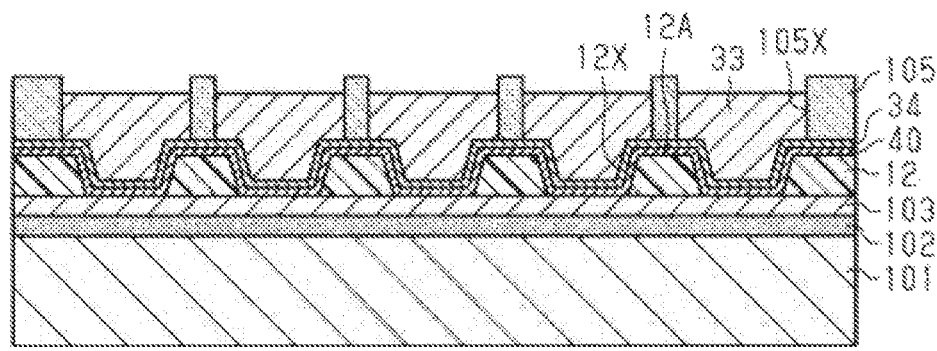

Subsequently, in a process of FIG. 3D, a resist layer 105 having an opening pattern 105X at a predetermined place is formed on the seed layer 34. The opening pattern 105X is formed to expose portions of the seed layer 34 corresponding to formation regions of a metal layer 33. As a material of the resist layer 105, for example, a material having plating resistance against plating processing of a next process may be used. For example, as a material of the resist layer 105, a photosensitive dry film resist or liquid form photoresist (for example, a dry film resist or liquid form resist of novolac-based resin, acryl-based resin or the like) may be used. For example, when using a photosensitive dry film resist, a dry film is laminated on the upper surface of the seed layer 34 by thermal pressing, and the dry film is patterned to form the resist layer 105 having the opening pattern 105X by a photolithography method. In the meantime, when using a liquid form photoresist, the resist layer 105 may be formed using the similar process.

Then, by using the resist layer 105 as a plating mask, an electrolytic plating method (here, an electrolytic copper plating method) in which the seed layer 34 is used as a plating power feeding layer is implemented on the seed layer 34 exposed from the opening pattern 105X of the resist layer 105. Thereby, the openings 12X at an inner side of the adhesion layer 40 and the seed layer 34 are filled, and a metal layer 33 is formed on the upper surface 12A of the solder resist layer 12 with the adhesion layer 40 and the seed layer 34 being interposed therebetween.

Subsequently, the resist layer 105 is removed by a peeling solution (for example, an organic amine-based peeling solution, caustic soda, acetone, ethanol or the like).

Figure 4A:
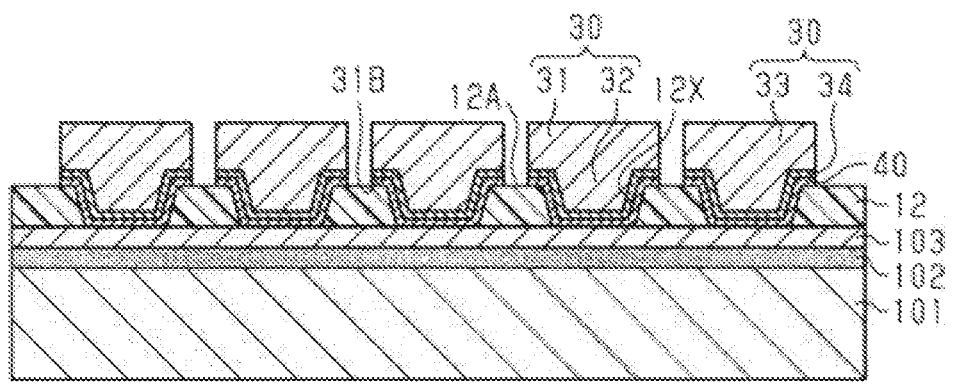
FIGS. 4A to 4C are schematic sectional views depicting the manufacturing method of the wiring substrate of the exemplary embodiment.

Then, in a process of FIG. 4A, by using the metal layer 33 as an etching mask, the unnecessary seed layer 34 is removed by etching (for example, wet etching). As an etching solution of the wet etching, for example, an acidic aqueous solution such as sulfuric acid-hydrogen peroxide aqueous solution (mixed aqueous solution of sulfuric acid and hydrogen peroxide). By this process, a wiring layer 30 including pad portions 31 formed on the upper surface 12A of the solder resist layer 12 with the adhesion layer 40 being interposed and protrusions 32 protruding downward from portions of the lower surfaces 31B of the pad portions 31 into the openings 12X is formed. The wiring layer 30 is configured by the metal layer 33 and the seed layer 34 covering the lower surface of the metal layer 33. At this time, the adhesion layer 40 is interposed between the wiring layer 30 and the solder resist layer 12.

Subsequently, by using the wiring layer 30 as an etching mask, the adhesion layer 40 is removed by etching. For example, when Ti is used as a material of the adhesion layer 40, the adhesion layer 40 is selectively etched and removed relative to the wiring layer 30 by a dry etching using an etching gas such as carbon tetrafluoride ($CF_4$) or a wet etching using a potassium hydroxide (KOH)-based etching solution.

Figure 4B:
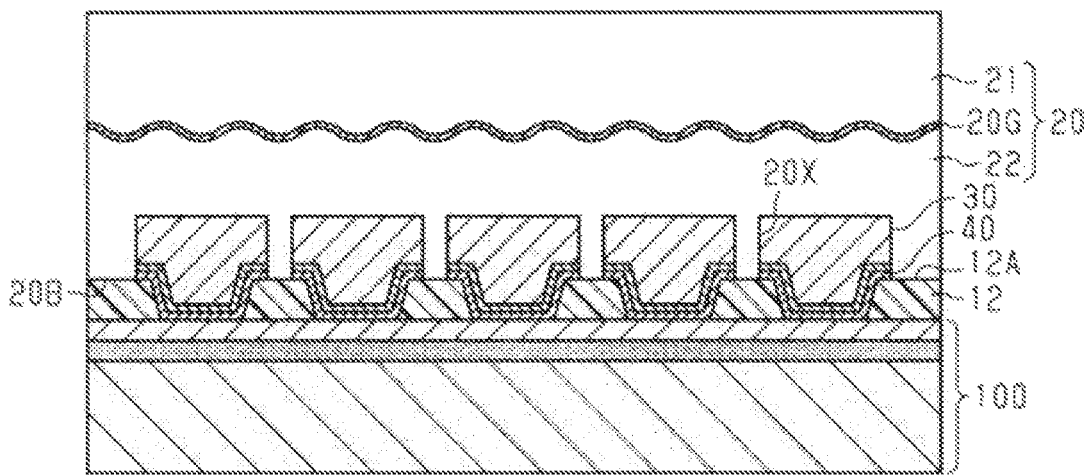

Subsequently, in a process of FIG. 4B, an insulation layer 20 covering an entire side surface of the adhesion layer 40 and an entire upper surface and an entire side surface of the wiring layer 30 is formed on the upper surface 12A of the solder resist layer 12. The insulation layer 20 may be formed by laminating a resin film on the upper surface 12A of the solder resist layer 12 and heating and curing the resin film to temperatures of about 130 to 200° C. while pressing the resin film, for example. Here, as the resin film, a resin film in which a thermosetting resin such as an epoxy resin is impregnated in a glass cloth 20G, which is a reinforcement material, may be used. In the insulation layer 20 formed by this process, an upper surface of the glass cloth 20G is covered by a resin layer 21 and a lower surface of the glass cloth 20G is covered by a resin layer 22 having the same thickness as the resin layer 21. For this reason, in the insulation layer 20, the glass cloth 20G is arranged in the vicinity of a center of the insulation layer 20 in the thickness direction. In the meantime, in this process, a thickness from the center of the glass cloth 20G to an upper surface of the resin layer 21 may be set to about 20 to 25 µm, for example, and a thickness from the center of the glass cloth 20G to a lower surface of the resin layer 22 may be set to about 20 to 25 µm, for example.

Also, by the process, concave portions 20X in which the wiring layer 30 and the adhesion layer 40 are to be accommodated are formed on the lower surface 20B of the insulation layer 20.

Figure 4C:
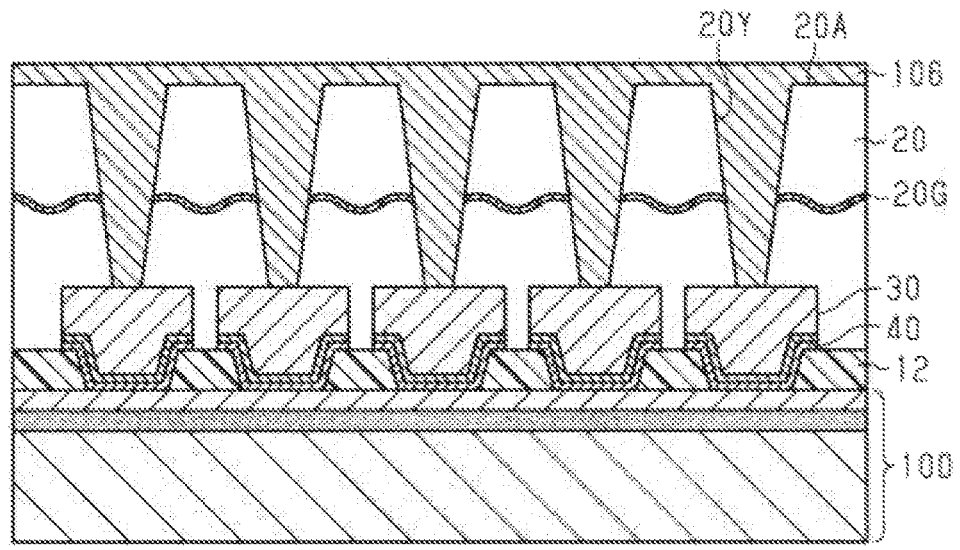

Continuously, in a process of FIG. 4C, the insulation layer 20 is formed at predetermined places with through-holes 20Y so that portions of the upper surface of the wiring layer 30 are to be exposed. The through-holes 20Y may be formed by a laser processing method using $CO_2$ laser, UV-YAG laser or the like.

Subsequently, when the through-holes 20Y are formed by the laser processing method, desmear processing is performed to remove resin smear attached to the exposed surface of the wiring layer 30 that is exposed to bottom portions of the through-holes 20Y In the meantime, inner surfaces of the through-holes 20Y and the upper surface 20A of the insulation layer 20 are roughened by the desmear processing.

Subsequently, a seed layer (not shown) covering the upper surface 20A of the insulation layer 20, the inner surfaces of the through-holes 20Y and the entire upper surface of the wiring layer 30 exposed to the through-holes 20Y is formed, and electrolytic plating in which the seed layer is used as a power feeding layer is implemented. For example, the seed layer is formed by an electroless copper plating method, and an electrolytic copper plating method in which the seed layer is used as a power feeding layer is implemented. Thereby, a conductive layer 106 filling the through-holes 20Y and covering the entire upper surface 20A of the insulation layer 20 is formed.

Figure 5A:
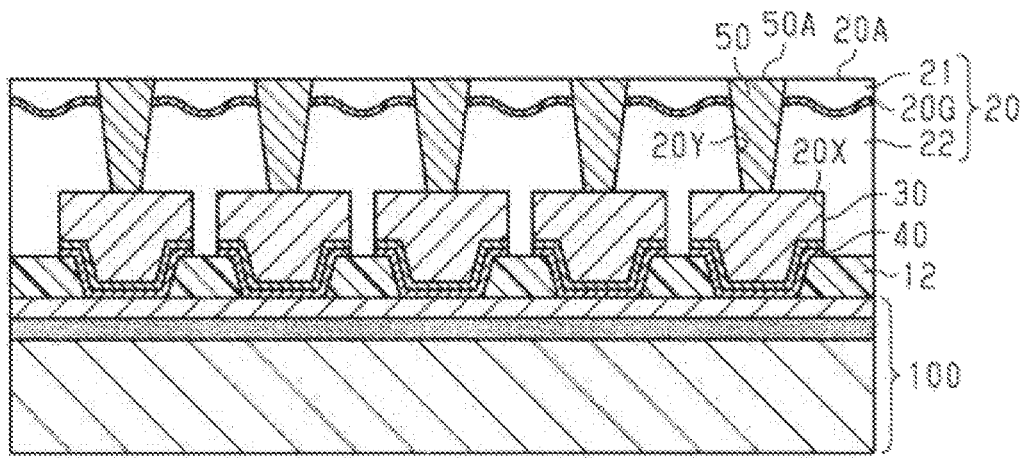
FIGS. 5A to 5C are schematic sectional views depicting the manufacturing method of the wiring substrate of the exemplary embodiment.

Continuously, the conductive layer 106 protruding from the upper surface 20A of the insulation layer 20 is polished and portions of the upper surface 20A of the insulation layer 20, which is a roughened surface, are polished by a CMP (Chemical Mechanical Polishing) method or the like, for example. Thereby, as shown in FIG. 5A, via-wirings 50 filled in the through-holes 20Y are formed, and upper end faces 50A of the via-wirings 50 and the upper surface 20A of the insulation layer 20 are formed to be substantially flush with each other. Also, the upper surface 20A of the insulation layer 20 is partially polished, so that the upper surface 20A of the insulation layer 20 is smoothened. By the polishing of this process, the upper surface 20A of the insulation layer 20 and the upper end faces 50A of the via-wiring 50 become polished surfaces.

Also, the upper surface 20A of the insulation layer 20 is partially polished, as described above, so that the resin layer 21 covering the upper surface of the glass cloth 20G in the insulation layer 20 is thinned. For this reason, a thickness of the resin layer 21 becomes thinner than the resin layer 22 covering the lower surface of the glass cloth 20G. Thereby, the glass cloth 20G, which has been provided in the vicinity of the center of the insulation layer 20 in the thickness direction before the polishing, is located at a position more leaning to the upper side (the upper surface 20A-side of the insulation layer 20) than the center of the insulation layer 20 in the thickness direction. Meanwhile, in the exemplary embodiment, the insulation layer 20 is polished so that the glass cloth 20G in the insulation layer 20 is not to be exposed from the resin layer 21. In this process, an amount of the insulation layer 20 to be polished may be set to about 5 to 10 µm, for example. For this reason, a thickness of the resin layer 21 after the polishing becomes about 10 to 15 µm, for example.

Subsequently, in a process of FIG. 5B, an adhesion film 81 is formed to cover the entire upper surface 20A of the insulation layer 20 and the entire upper end faces 50A of the via-wirings 50. As a material of the adhesion film 81, metal such as Ti, TaN, Ta, Ni, Cr and the like or an alloy including at least one selected from the metals may be used. The adhesion film 81 may be formed by a sputter method or a vapor deposition method, for example. Continuously, a seed layer 82 is formed to cover an entire upper surface of the adhesion film 81. As a material of the seed layer 82, for example, copper or copper alloy may be used. The seed layer 82 may be formed by a sputter method, a vapor deposition method, an electrolytic plating method or an electroless plating method, for example.

For example, when forming the adhesion film 81 and the seed layer 82 by the sputter method, titanium is first deposited on the upper surface 20A of the insulation layer 20 and the upper end faces 50A of the via-wirings 50 so as to cover the upper surface 20A and the upper end faces 50A by sputtering, so that the adhesion film 81 is formed. Then, copper is deposited on the adhesion film 81 by sputtering, so that the seed layer 82 is formed.

Subsequently, a resist layer 107 having an opening pattern 107X at a predetermined place is formed on the seed layer 82. The opening pattern 107X is formed so as to expose portions of the seed layer 82 corresponding to formation regions of the wiring layer 60. (refer to FIG. 1A). As a material of the resist layer 107, for example, a material having plating resistance against plating processing of a next process may be used. For example, as a material of the resist layer 107, the same material as the resist layer 105 (refer to FIG. 3D) may be used. Also, the resist layer 107 may be formed by the same method as the resist layer 105.

Subsequently, an electrolytic plating method in which the seed layer 82 is used as a plating power feeding layer is implemented on an upper surface of the seed layer 82 by using the resist layer 107 as a plating mask. Specifically, an electrolytic plating method (here, an electrolytic copper plating method) is implemented on the upper surface of the seed layer 82 exposed from the opening pattern 107X of the resist layer 107, so that a metal layer 83 (electrolytically plated metal layer) is formed on the upper surface of the seed layer 82. Thereby, the adhesion film 81, the seed layer 82 and the metal layer 83 are stacked in corresponding order on the upper surface 20A of the insulation layer 20 exposed to the opening pattern 107X of the resist layer 107.

Continuously, the resist layer 107 is removed by an alkaline peeling solution, for example. Subsequently, by using the metal layer 83 as an etching mask, the unnecessary seed layer 82 is removed by etching. Thereafter, by using the metal layer 83 and the seed layer 82 (Cu film, here) after the etching as an etching mask, the unnecessary adhesion film 81 (Ti here) is removed by etching. By the removal processing, a wiring layer 60 having the adhesion film 81, the seed layer 82 and the metal layer 83 stacked in corresponding order is formed on the upper end faces 50A of the via-wirings 50 and the upper surface 20A of the insulation layer 20, as shown in FIG. 5C. In this way, the wiring layer 60 is formed by a semi-additive method. In the meantime, in FIGS. 6 to 8, the adhesion film 81, the seed layer 82 and the metal layer 83 are not shown, and are instead shown as the wiring layer 60.

Figure 6A:
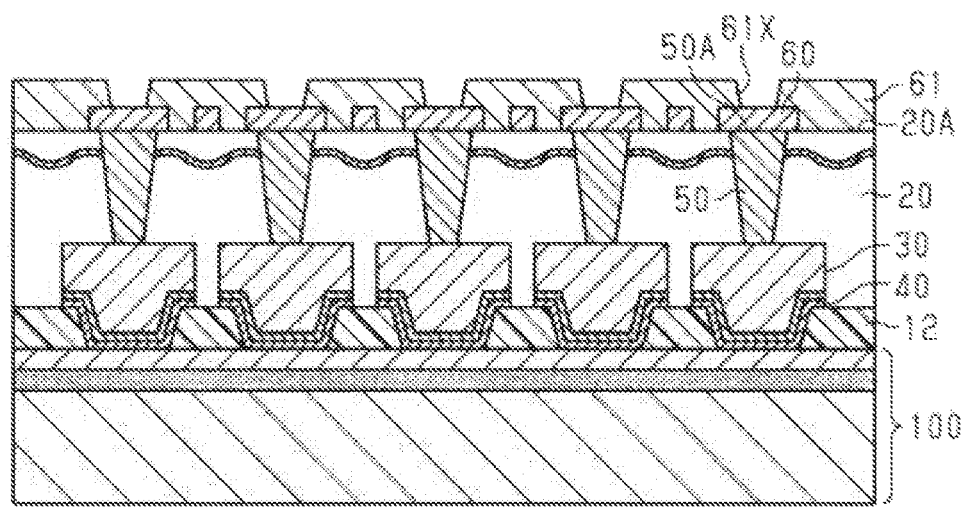
FIGS. 6A and 6B are schematic sectional views depicting the manufacturing method of the wiring substrate of the exemplary embodiment.

Subsequently, in a process of FIG. 6A, an insulation layer 61 having through-holes 61X configured to expose portions of an upper surface of the wiring layer 60 is formed on the upper surface 20A of the insulation layer 20. For example, when using a resin film as the insulation layer 61, a resin film is laminated on the upper surface 20A of the insulation layer by thermal pressing, and the resin film is patterned to form the insulation layer 61 by a photolithography method. Alternatively, a liquid form or paste-like insulating resin is applied to the upper surface 20A of the insulation layer 20 by a spin coat method or the like, and the insulating resin is patterned to form the insulation layer 61 by the photolithography method.

Figure 5B:
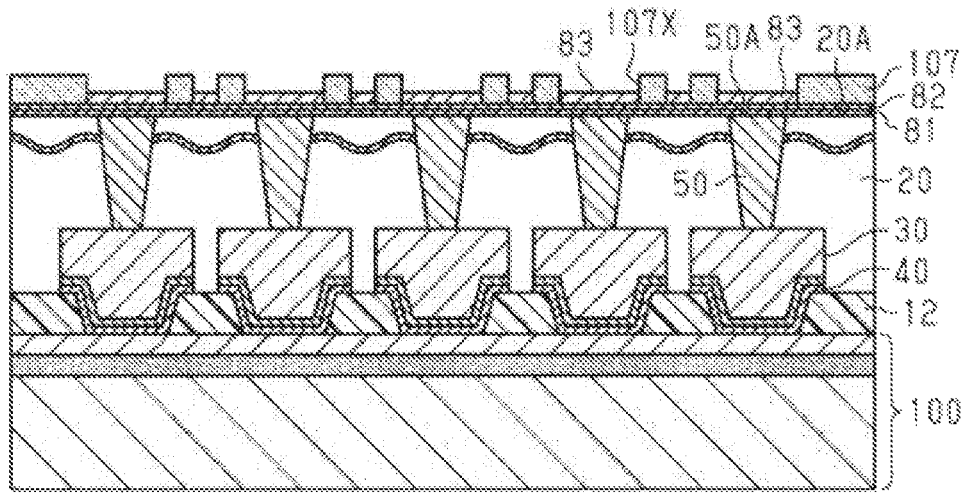
Figure 5C:
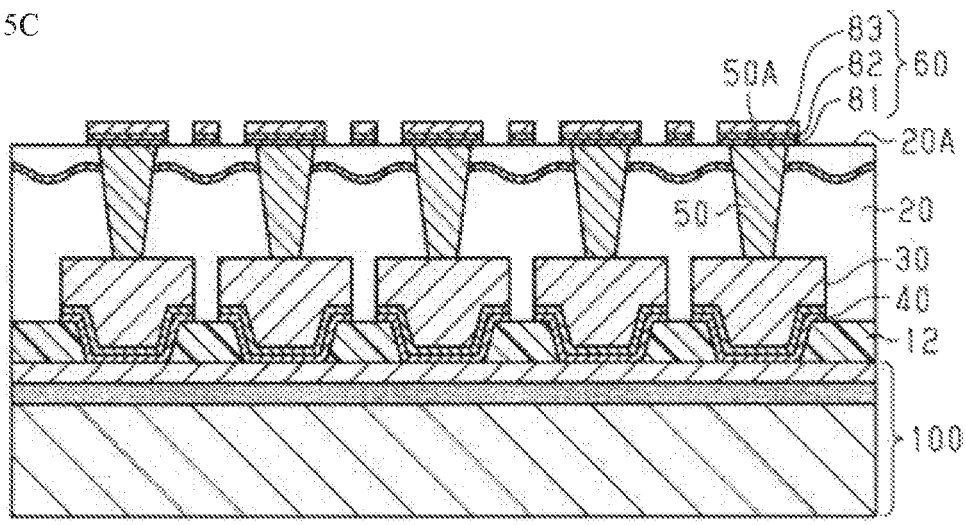
Figure 6B:
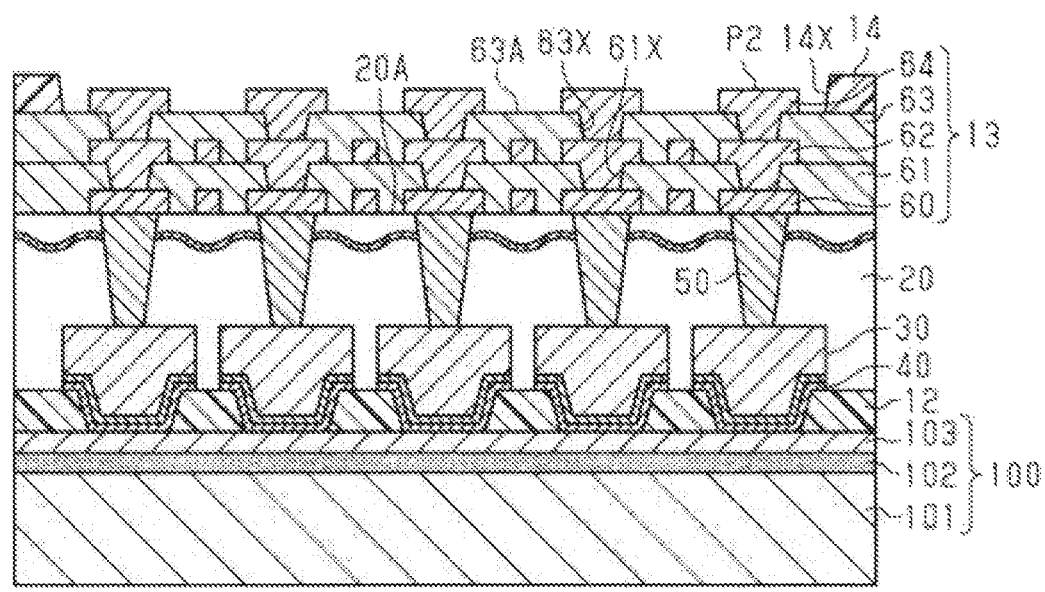

Continuously, in a process of FIG. 6B, like the processes shown in FIGS. 5B and 5C, a wiring layer 62 including via-wirings filled in the through-holes 61X and a wiring pattern electrically connected to the wiring layer 60 through the via-wirings and stacked on the insulation layer 61 is formed by the semi-additive method, for example. Then, like the process shown in FIG. 6A, an insulation layer 63 having through-holes 63X configured to expose portions of an upper surface of the wiring layer 62 is formed on the insulation layer 61. Subsequently, like the processes shown in FIGS. 5B and 5C, a wiring layer 64 including via-wirings filled in the through-holes 63X and connection terminals P2 electrically connected to the wiring layer 62 through the via-wirings and stacked on an upper surface 63A of the insulation layer 63 is formed by the semi-additive method, for example. In the meantime, as needed, a surface-treated layer may be formed on a surface of the connection terminal P2 (an upper surface and a side surface or only the upper surface).

By the above manufacturing processes, it is possible to manufacture a wiring structure 13 on the upper surface 20A of the insulation layer 20.

Subsequently, a solder resist layer 14 having openings 14X is formed on the upper surface 63A of the insulation layer 63. The solder resist layer 14 may be formed by laminating a photosensitive solder resist film or applying a liquid form solder resist and patterning the resist by the photolithography method.

Figure 7A:
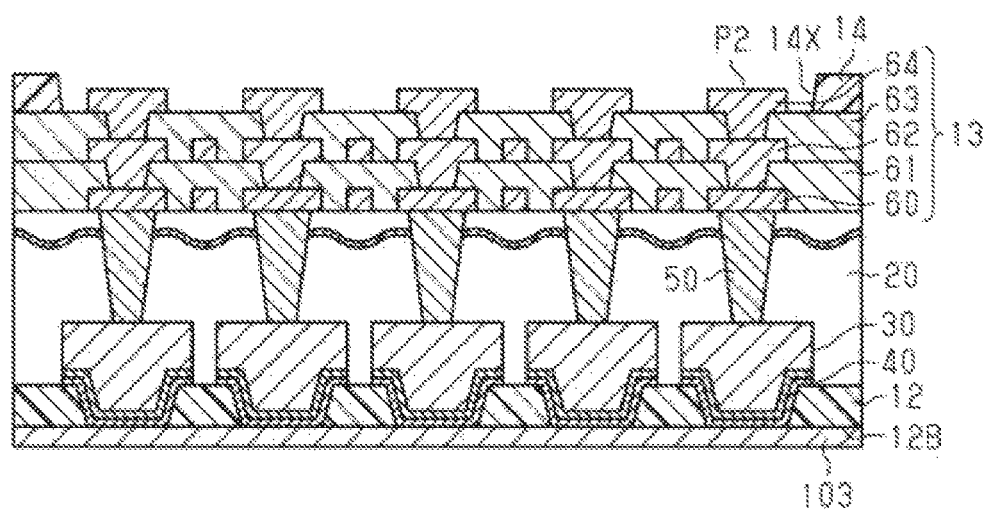
FIGS. 7A and 7B are schematic sectional views depicting the manufacturing method of the wiring substrate of the exemplary embodiment.

Subsequently, the support body copper foil 101 of the support substrate 100 is mechanically peeled off from the extremely thin copper foil 103. At this time, since the release layer 102 is interposed between the support body copper foil 101 and the copper foil 103 and an adhesive force between the support body copper foil 101 and the copper foil 103 is weak, it is possible to easily peel off the support body copper foil 101 from the copper foil 103. Thereby, as shown in FIG. 7A, only the copper foil 103 remains on the lower surface 12B of the solder resist layer 12.

Figure 7B:
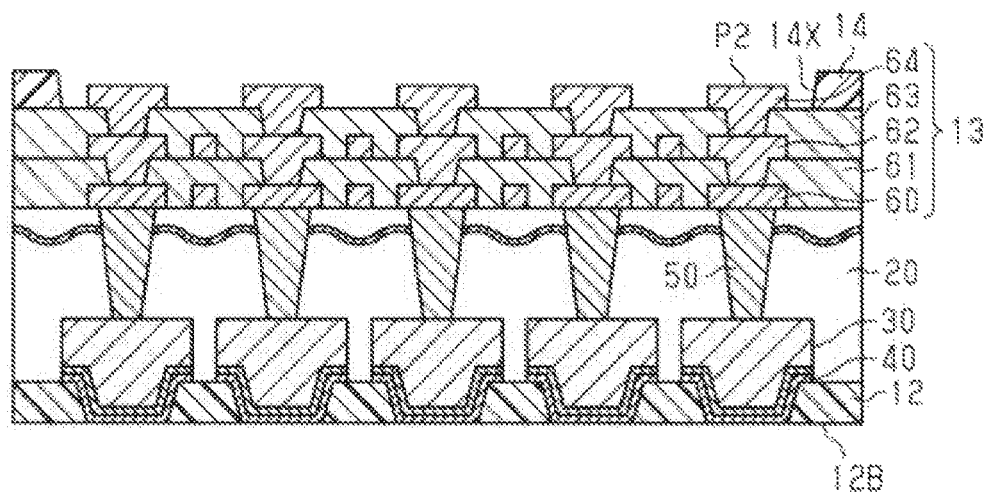

Subsequently, the copper foil 103 remaining on the lower surface 12B of the solder resist layer 12 and the lower surface of the adhesion layer 40 is removed by a wet etching using an aqueous ferric chloride solution, an aqueous copper chloride solution, an aqueous ammonium persulfate solution or the like. At this time, the adhesion layer 40 and the solder resist layer 12 function as stopper layers when etching the copper foil 103. By this process, the lower surface 12B of the solder resist layer 12 and the lower surface of the adhesion layer 40 are exposed to an outside, as shown in FIG. 7B. At this time, the lower surface 12B of the solder resist layer 12 and the lower surface of the adhesion layer 40, which were in contact with the upper surface of the copper foil 103 (refer to FIG. 7A), are formed to be substantially flush with each other.

Figure 8A:
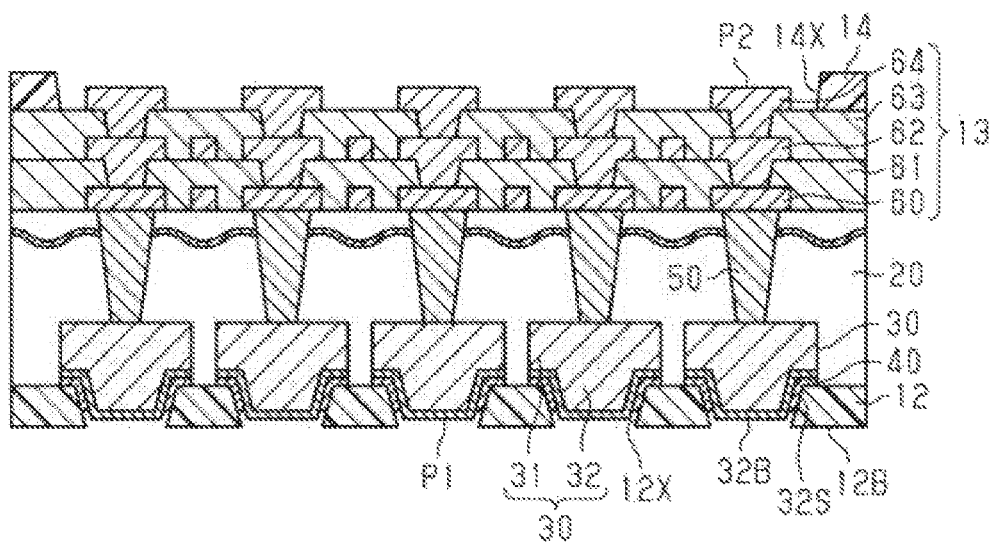
FIGS. 8A and 8B are schematic sectional views depicting the manufacturing method of the wiring substrate of the exemplary embodiment.

Subsequently, in a process of FIG. 8A, the adhesion layer 40 is thinned from the lower surface thereof, so that the lower end faces 32B of the protrusions 32 of the wiring layer 30 are exposed to the outside. In the exemplary embodiment, the adhesion layer 40 is thinned until portions of the side surfaces 32S of the protrusions 32 are exposed. By this process, the lower end faces 32B of the protrusions 32 are exposed from the openings 12X of the solder resist layer 12, as pads Pt for external connection. For example, when Ti is used as the material of the adhesion layer 40, the adhesion layer 40 may be thinned by selectively etching and removing the adhesion layer 40 relative to the wiring layer 30 by a dry etching using an etching gas such as $CF_4$ or a wet etching using a KOH-based etching solution. In the meantime, as needed, a surface-treated layer may be formed on the surfaces (the lower end faces 32B and the side surfaces 32S or only the lower end faces 32B) of the protrusions 32 exposed from the adhesion layer 40.

Figure 8B:
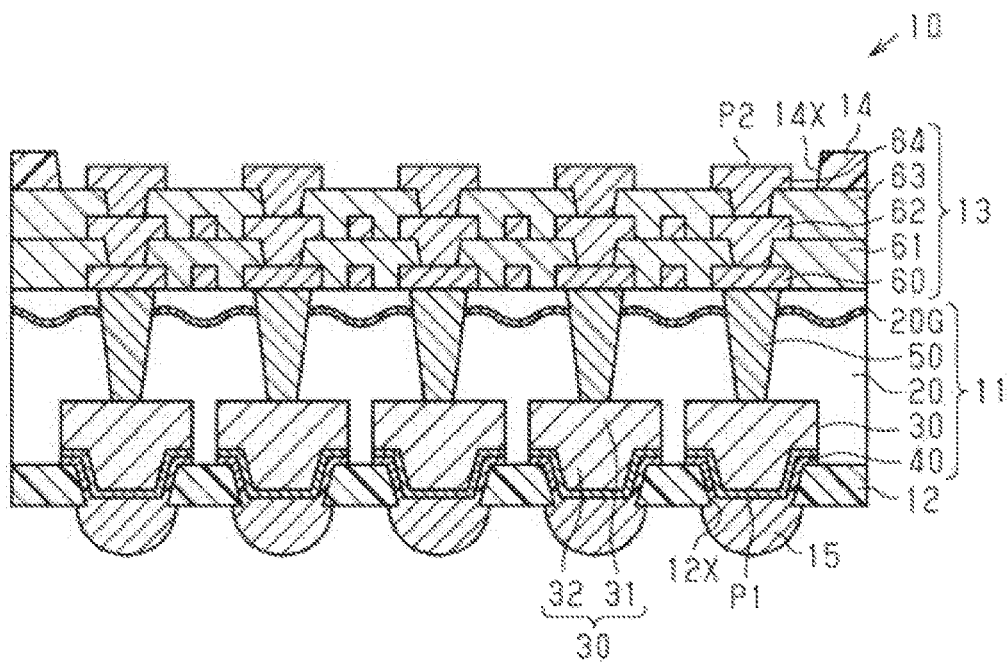

Subsequently, in a process of FIG. 8b, external connection terminals 15 are formed on the pads P1 for external connection. For example, a flux is appropriately applied onto the pads P1 for external connection exposed to the openings 12X of the solder resist layer 12, and solder balls are mounted thereto and fixed by reflow at temperatures of about 240 to 260° C. Thereafter, the surface is cleaned to remove the flux. Thereby, the external connection terminals 15 (solder bumps) are formed on the pads P1 for external connection.

By the above processes, it is possible to manufacture the wiring substrate 10 of exemplary embodiment.

Subsequently, operations and effects of the exemplary embodiment are described.

(1) The adhesion layer 40 having higher adhesiveness with the solder resist layer 12 than the wiring layer 30 is interposed between the wiring layer 30 to function as the pads P1 for external connection and the solder resist layer 12. By the adhesion layer 40, it is possible to improve the adhesiveness between the wiring layer 30 and the solder resist layer 12. For this reason, even when bending or thermal stress occurs in the wiring substrate 10, for example, it is possible to suppress the solder resist layer 12 from being peeled off from the wiring layer 30.

Also, the wiring layer 30 is configured by the pad portion 31 formed on the upper surface 12A of the solder resist layer 12 with the adhesion layer 40 being interposed therebetween and the protrusion 32 protruding from the lower surface 31B of the pad portion 31 into the opening 12X of the solder resist layer 12. Also, the adhesion layer 40 is formed to cover the lower surface 31B of the pad portion 31 and the side surface 32S of the protrusion 32. Thereby, since it is possible to stereoscopically (three dimensionally) form the adhesion layer 40, it is possible to increase a contact area between the adhesion layer 40 and the solder resist layer 12. Therefore, it is possible to further improve the adhesiveness between the adhesion layer 40 and the solder resist layer 12.

(2) The lower end face 41B of the adhesion layer 40 is formed to be more concave upward than the lower end face 32B of the protrusion 32. Thereby, the side surface 32S of the protrusion 32 is partially exposed from the adhesion layer 40 and the solder resist layer 12. For this reason, when the external connection terminal 15 is formed on the pad P1 for external connection, the external connection terminal 15 is bonded to a part of the side surface 32S of the protrusion 32 and the lower end face 32B of the protrusion 32.

Therefore, as compared to a configuration where the external connection terminal 15 is bonded to only the lower end face 32B of the protrusion 32, it is possible to increase a bonding area between the external connection terminal 15 and the protrusion 32, so that it is possible to improve connection reliability between the external connection terminal 15 and the protrusion 32. As a result, it is possible to favorably suppress the external connection terminal 15 from separating from the pad P1 for external connection.

(3) The opening 12X of the solder resist layer 12 is formed so that the opening width decreases from the upper surface 12A of the solder resist layer 12 toward the lower surface 12B. For this reason, the corner portion 12C of the solder resist layer 12, which is the lower opening end of the opening 12X, is formed so that the angle between the lower surface 12B of the solder resist layer 12 and the inner surface of the opening 12X is to be an acute angle, and is formed to partially overlap the adhesion layer 40, as seen from above. Thereby, when the external connection terminal 15 is formed on the pad P1 for external connection, it is possible to make the corner portion 12C of the solder resist layer 12 bite the external connection terminal 15. Since the corner portion 12C (i.e., the lower opening end of the opening 12X) becomes a wedge, it is possible to favorably suppress the external connection terminal 15 from separating from the pad P1 for external connection.

(4) The lower end face 32B of the protrusion 32 is located at a position higher than the lower surface 12B of the solder resist layer 12. For this reason, a step is formed by the lower surface 12B of the solder resist layer 12 and the lower end face 32B of the protrusion 32. When a solder ball is put in the opening 12X in which the step is exposed to the outside, movement of the solder ball is restrained by the step in the opening 12X. Thereby, for example, upon the reflow, the solder ball is difficult to move to the outside of the opening 12X. Therefore, it is possible to suppress occurrence of a so-called missing bump where the external connection terminal 15 (solder bump) is not formed on the pad P1 for external connection.

(5) In the meantime, according to a manufacturing method of the wiring substrate of the related art, a wiring structure is formed on a support substrate, and a solder resist layer is formed on an outermost layer of the wiring structure after removing the support substrate. However, when the sufficient stiffness is not secured only by the wiling structure, the wiring structure is bent after removing the support substrate, so that it is not possible to form the solder resist layer on the outermost layer of the wiling structure.

In contrast, according to the exemplary embodiment, the solder resist layer 12 is formed on the support substrate 100, the wiring structure 11 and the wiring structure 13 are formed on the solder resist layer 12, and the support substrate 100 is removed after forming the solder resist layer 14 on the outermost layer of the wiring structure 13. That is, the solder resist layers 12, 14 are formed before removing the support substrate 100. For this reason, even when the wiring structures 11, 13 are bent after removing the support substrate 100, the problem that the solder resist layers 12, 14 cannot be formed does not occur. In particular, since the solder resist layer 12 to be formed on the support substrate 100 at the pad P1 for external connection-side is formed before removing the support substrate 100, it is possible to beforehand prevent the problem that it is not possible to form the solder resist layer 12 due to the bending.

Other Exemplary Embodiments

The above exemplary embodiment can be modified as follows. The above exemplary embodiment and following modified embodiments can be implemented in combination as long as there is no technical inconsistency.

In the above exemplary embodiment, the lower end face 41B of the adhesion layer 40 is formed to be more concave upward than the lower end face 32B of the protrusion 32. However, the present disclosure is not limited thereto.

Figure 9:
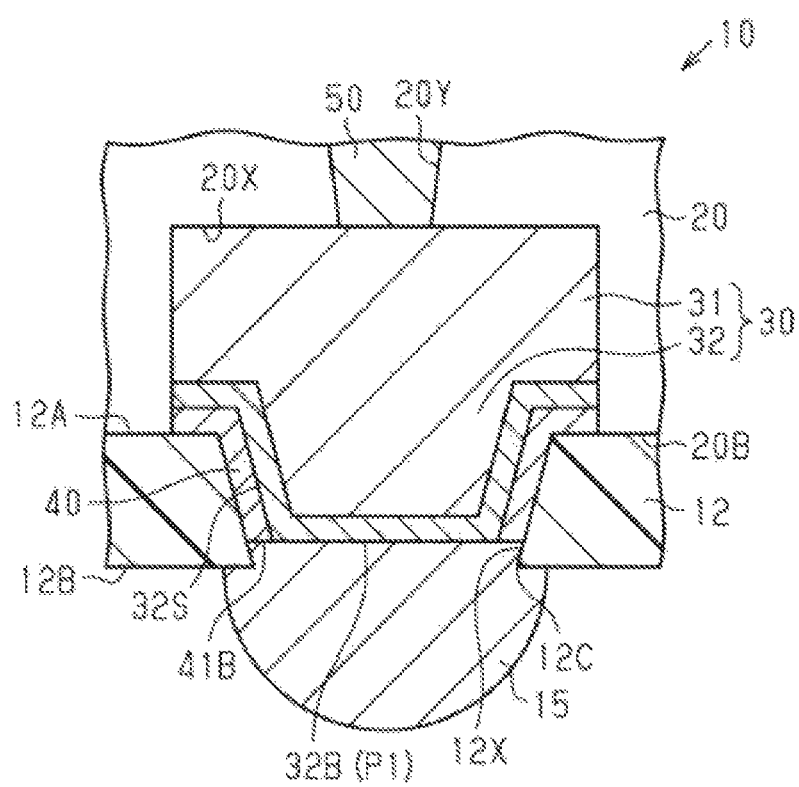
FIG. 9 is an enlarged sectional view of a part of a wiring substrate of a modified embodiment.

For example, as shown in FIG. 9, the lower end face 41B of the adhesion layer 40 may be formed to be substantially flush with the lower end face 32B of the protrusion 32. In this case, the entire side surface 32S of the protrusion 32 is covered by the adhesion layer 40.

In the above exemplary embodiment, the solder bump is used as the external connection terminal 15. However, the present disclosure is not limited thereto.

Figure 10:
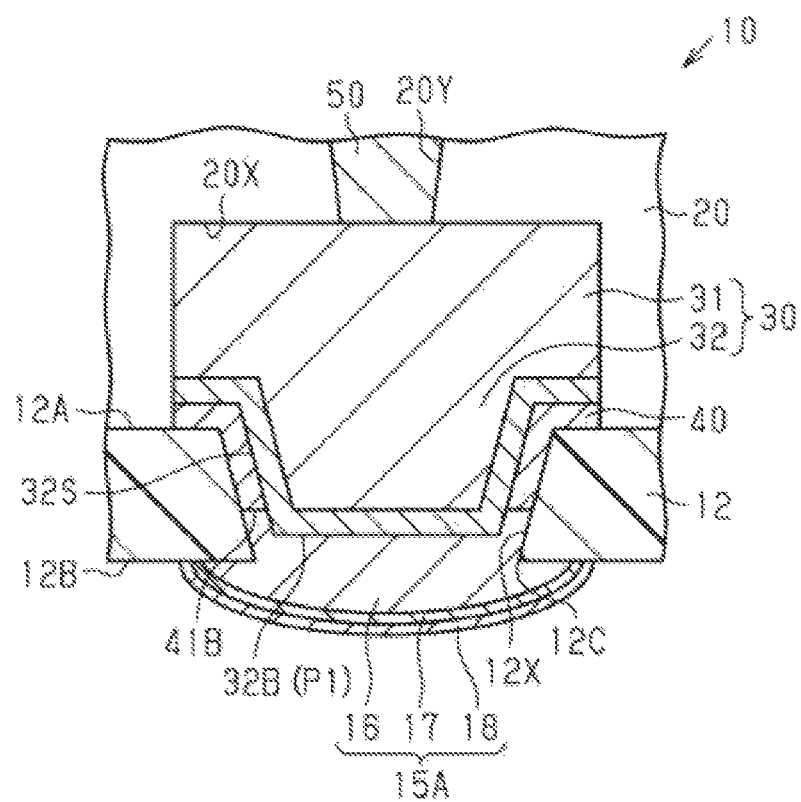
FIG. 10 is an enlarged sectional view of a part of a wiring substrate of a modified embodiment.

For example, as shown in FIG. 10, an external connection terminal 15A may be configured by a plurality of metal layers 16, 17, 18. In this modified embodiment, the external connection terminal 15A is a metal layer having a three-layered structure where the metal layer 16, the metal layer 17 and the metal layer 18 are stacked in corresponding order from the surface of the pad P1 for external connection. The metal layer 16, 17, 18 may be formed by the electroless plating method, for example.

The metal layer 16 is formed to cover the entire lower end face 32B (the pad P1 for external connection) of the protrusion 32. The metal layer 16 is formed to enter the opening 12X. The metal layer 16 is formed to fill the opening 12X exposed from the protrusion 32 and the adhesion layer 40, for example. The metal layer 16 is formed to cover the lower end face 41B of the adhesion layer 40 and to cover the side surface 32S of the protrusion 32 exposed from the adhesion layer 40, for example. The metal layer 16 is formed to cover the inner surface of the opening 12X exposed from the adhesion layer 40, to cover the lower surface 12B of the solder resist layer 12 located at a peripheral edge of the opening 12X and to be bitten by the corner portion 12C of the solder resist layer 12. In other words, the corner portion 12C of the solder resist layer 12 is formed to bite into the metal layer 16. Also, the metal layer 16 is formed to have a substantially semi-elliptical section on the lower surface 12B of the solder resist layer 12, for example.

As a material of the metal layer 16, a metal material having a higher coefficient of elasticity than the metal (Cu, here) configuring the wiring layer 30 is preferably used. As a material of the metal layer 16, for example, a metal material including Ni may be used. That is, as a material of the metal layer 16, for example, Ni or Ni alloy may be used.

The metal layer 17 is formed to cover an entire lower surface of the metal layer 16. As a material of the metal layer 17, for example, Pd or Pd alloy may be used. A thickness of the metal layer 17 may be set to about 0.1 to 0.5 μm, for example.

The metal layer 18 is formed to cover an entire lower surface of the metal layer 17. As a material of the metal layer 18, for example, a metal material that is more difficult to be oxidized than the metal (Cu, here) configuring the wiring layer 30 may be used. For example, as a material of the metal layer 18, Au or Au alloy may be used. A thickness of the metal layer 18 may be set to about 0.1 to 0.3 μm, for example.

Even when the external connection terminal 15A configured by the metal layers 16, 17, 18 is adopted, it is possible to achieve the same effects as the above exemplary embodiment.

Also, the metal layer 16, which is formed to cover the corner portion 12C of the solder resist layer 12, of the external connection terminal 15A is formed of the metal material having a higher coefficient of elasticity than the metal (Cu, here) configuring the wiring layer 30. Here, the corner portion 12C of the solder resist layer 12 is a portion at which the stress is likely to be concentrated. Since the corner portion 12C is covered by the metal layer 16 having a relatively high coefficient of elasticity, it is possible to favorably suppress the external connection terminal 15A from being damaged.

In the modified embodiment, as the external connection terminal 15A, the metal layer where the metal layer 16 (Ni layer), the metal layer 17 (Pd layer) and the metal layer 18 (Au layer) are stacked in corresponding order from the pad P1 for external connection is adopted. However, the present disclosure is not limited thereto. For example, as the external connection terminal 15A, a metal layer where a Ni layer and an Au layer are stacked in corresponding order, a metal layer where a Ni layer, a Pd layer and an Ag layer are stacked in corresponding order, and a metal layer where a Ni layer, a Pd layer, an Ag layer and an Au layer are stacked in corresponding order may be adopted from the surface of the pad for external connection.

In the above exemplary embodiment, the opening 12X of the solder resist layer 12 is formed so that the opening width decreases from the upper surface 12A of the solder resist layer 12 toward the lower surface 12B. However, the present disclosure is not limited thereto. For example, the opening 12X may be formed to have a straight shape (a substantially rectangular shape, as seen from a section). Specifically, the opening 12X may be formed so that the opening width at the upper opening end and the opening width at the lower opening end are substantially to be the same.

In the above exemplary embodiment, the numbers of the layers of the wiring layers 60, 62, 64 and the insulation layers 61, 63, the arrangement of the wirings and the like in the wiring structure 13 can be diversely modified/changed. For example, the wiring layer 60 may be omitted from the wiring structure 13.

Figure 11:
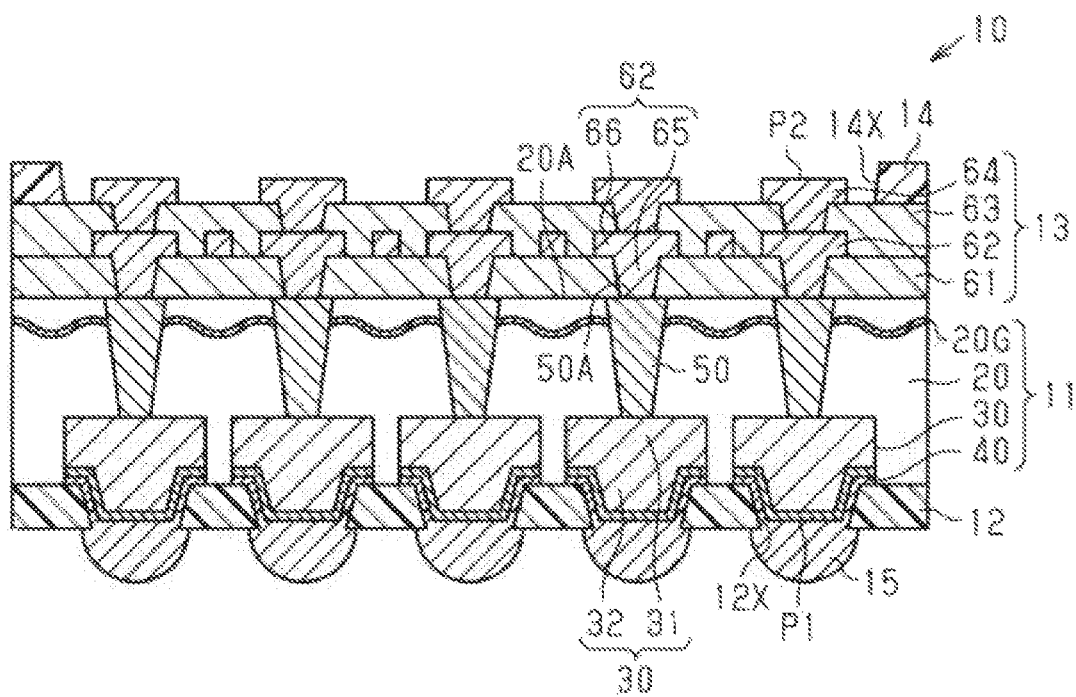
FIG. 11 is an enlarged sectional view of a part of a wiring substrate of a modified embodiment.

In this case, as shown in FIG. 11, for example, the lower end face of the via-wiring 65 penetrating the insulation layer 61 in the thickness direction is directly connected to a portion of the upper end face 50A of the via-wiring 50. That is, the upper end face 50A of the via-wiring 50 and the lower end face of the via-wiring 65 are in contact with each other, and the via-wiring 50 and the via-wiring 65 are electrically interconnected. In other words, the via-wiring 50 and the via-wiring 65 are electrically connected but are separately formed, other than being integrally formed. In this case, the wiring layer 62 is configured by the via-wiring 65 and the wiring pattern 66 formed on the upper surface of the insulation layer 61 and electrically connected to the via-wiring 50 through the via-wiring 65. The via-wiring 65 and the wiring pattern 66 are integrally formed.

In the above exemplary embodiment, the glass cloth 20G is arranged in the insulation layer 20 so as not to be exposed from the upper surface 20A of the insulation layer 20. However, the present disclosure is not limited thereto. For example, a part of the glass cloth 20G may be exposed from the upper surface 20A of the insulation layer 20. In this case, however, the degree of roughness of the upper surface 20A of the insulation layer 20 increases due to the exposed glass cloth 20G. For this reason, it is difficult to form a fine wiring on the upper surface 20A of the insulation layer 20. Therefore, when the glass cloth 20G is exposed from the upper surface 20A of the insulation layer 20, the lower end face of the via-wiring 65 is preferably directly connected to the upper end face 50A of the via-wiring 50, like the wiring substrate 10 shown in FIG. 11.

In the above exemplary embodiment, the glass cloth 20G is provided with more leaning to the wiring structure 13 than the center of the insulation layer 20 in the thickness direction. However, the present disclosure is not limited thereto. For example, the glass cloth 20G may be provided in the vicinity of the center of the insulation layer 20 in the thickness direction.

In the above exemplary embodiment, the insulation layer 20 configured to cover the wiring layer 30 functioning as the pad P1 for external connection is formed by the insulation layer having the reinforcement material therein. However, the present disclosure is not limited thereto. For example, the insulation layer 20 may be configured by an insulation layer in which the reinforcement material is not contained. As a material of the insulation layer 20, for example, a non-photosensitive insulating resin of which a main component is a thermosetting resin may be used.

In the above exemplary embodiment, the upper end face 50A of the via-wiring 50 is formed to be flush with the upper surface 20A of the insulation layer 20. However, the present disclosure is not limited thereto. For example, the upper end face 50A of the via-wiring 50 may be formed to be more concave downward than the upper surface 20A of the insulation layer 20. Also, the upper end face 50A of the via-wiring 50 may be formed to protrude more upward than the upper surface 20A of the insulation layer 20.

In the above exemplary embodiment, the arrangement and the like of the via-wiring 50 and the wiring layer 30 in the wiring structure 11 may be diversely modified/changed.

In the above exemplary embodiment, the wiring structure 13 that is a high-density wiring layer is formed on the wiring structure 11 that is a low-density wiring layer. However, the present disclosure is not limited thereto.

Figure 12:
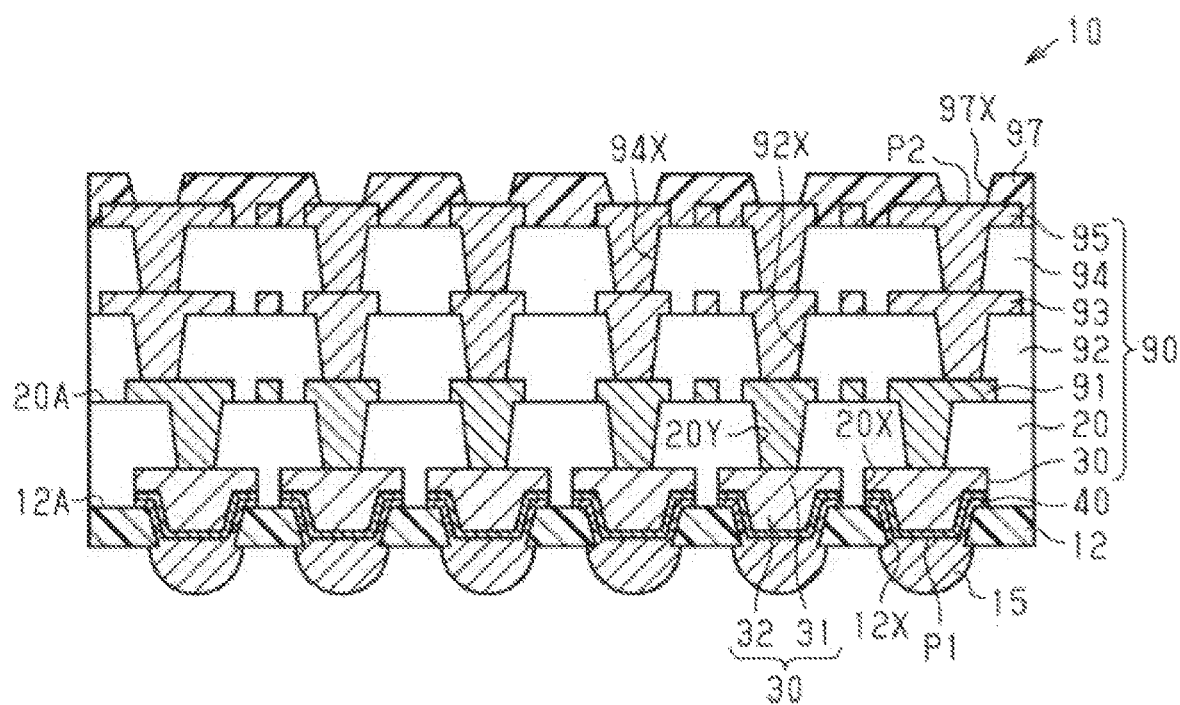
FIG. 12 is a schematic sectional view depicting a wiring substrate of a modified embodiment.

For example, as shown in FIG. 12, instead of the wiring structures 11, 13, a wiring substrate 90 having a cureless structure, in which the core substrate is not included, may be used.

The wiring structure 90 has such a structure that the wiring layer 30, the insulation layer 20, a wiring layer 91, an insulation layer 92, a wiring layer 93, an insulation layer 94, and a wiring layer 95 are sequentially stacked on the upper surface 12A of the solder resist layer 12.

As a material of the wiring layers 91, 93, 95, for example, copper or copper alloy may be used. As a material of the insulation layers 20, 92, 94, for example, a non-photosensitive insulating resin of which a main component is a thermosetting resin such as an epoxy-based resin may be used. Also, as a material of the insulation layers 20, 92, 94, for example, an insulating resin of which a main component is a photosensitive resin such as a phenol-based resin and a polyimide-based resin may be used.

The wiring layer 91 is electrically connected to the wiring layer 30. The wiring layer 91 has such a structure that the via-wirings filled in the through-holes 20Y and the wiring pattern formed on the upper surface 20A of the insulation layer 20 are integrally formed.

The insulation layer 92 is formed on the upper surface 20A of the insulation layer 20 so as to cover the wiring layer 91. The insulation layer 92 is formed at desired places with through-holes 92X penetrating the insulation layer 92 in the thickness direction and configured to expose portions of an upper surface of the wiring layer 91.

The wiring layer 93 is electrically connected to the wiring layer 91. The wiring layer 93 has such a structure that the via-wirings filled in the through-holes 92X and the wiring pattern formed on the upper surface of the insulation layer 92 are integrally formed.

The insulation layer 94 is formed on an upper surface of the insulation layer 92 so as to cover the wiring layer 93. The insulation layer 94 is formed at desired places with through-holes 94X penetrating the insulation layer 94 in the thickness direction and configured to expose portions of an upper surface of the wiring layer 93.

Here, the through-holes 20Y, 92X, 94X have a tapered shape where an opening width decreases from the upper side (the wiring layer 95-side) toward the lower side (the wiring layer 30-side) in FIG. 12, for example, respectively. For example, the through-holes 20Y 92X, 94X have a substantially inverted conical shape where an opening diameter of the upper opening end is larger than an opening diameter of the lower opening end, respectively.

The wiring layer 95 is electrically connected to the wiring layer 93. The wiring layer 95 has such a structure that the via-wirings filled in the through-holes 94X and the wiring pattern formed on the upper surface of the insulation layer 94 are integrally formed.

On the upper surface of the insulation layer 94, a solder resist layer 97 having openings 97X for exposing portions of the wiring layer 95 as connection terminals P2 is formed.

In the meantime, the numbers of the layers of the wiring layers 30, 91, 93, 95 and the insulation layers 20, 92, 94, the arrangement of the wirings and the like in the wiring structure 90 can be diversely modified/changed.

In the above exemplary embodiment, the semiconductor chip 71 is mounted on the wiring substrate 10. However, the present disclosure is not limited thereto. For example, instead of the semiconductor chip 71, an electronic component such as a chip component, for example, a chip capacitor, a chip resistance, a chip inductor and the like, a quartz oscillator and the like may be mounted on the wiring substrate 10.

Also, the mounting aspect (for example, flip chip mounting, wire bonding mounting, soldering mounting or a combination thereof) of the electronic component such as the semiconductor chip 71, the chip component and the quartz oscillator may be diversely modified/changed.

In the above exemplary embodiment, the solder resist layer 14 may be omitted.

In the above exemplary embodiment, the solder resist layer 12 has been exemplified as the protective insulation layer, which is the outermost layer of the wiring substrate 10. However, the protective insulation layer may be formed by a variety of photosensitive insulating resins.

In the above exemplary embodiment, the manufacturing method of multiple patterning (the plurality of the wiring substrates are collectively manufactured) has been implemented. However, a manufacturing method of single patterning (a single wiring substrate is manufactured) may be implemented.

This disclosure further encompasses various exemplary embodiments, for example, described below.

1. A manufacturing method of a wiring substrate, comprising:
    forming, on a support substrate, a protective insulation layer having an opening configured to expose an upper surface of the support substrate;
    forming an adhesion layer configured to cover an upper surface of the protective insulation layer and an inner surface of the opening;
    forming, on the adhesion layer, a first wiring layer having a protrusion filling the opening and a pad portion formed on the upper surface of the protective insulation layer with the adhesion layer being interposed therebetween;
    removing the adhesion layer by using the first wiring layer as a mask;
    forming, on the upper surface of the protective insulation layer, a first insulation layer configured to cover the first wiring layer and the adhesion layer;
    removing the support substrate; and
    exposing a lower end face of the protrusion by thinning the adhesion layer from a lower surface of the adhesion layer.

What is claimed is:

1. A wiring substrate comprising:
    a first insulation layer including a concave portion formed in a lower surface of the first insulation layer;
    a first wiring layer formed in the concave portion;
    a protective insulation layer having an opening configured to expose a part of the first wiring layer and stacked on the lower surface of the first insulation layer; and
    an adhesion layer interposed between the first wiring layer and the protective insulation layer and having higher adhesiveness with the protective insulation layer than the first wiring layer,
    wherein the first wiring layer is formed on an upper surface of the protective insulation layer with the adhesion layer being interposed therebetween, and comprises a pad portion formed in the concave portion and a protrusion protruding from a portion of a lower surface of the pad portion into the opening,
    wherein the adhesion layer is formed to cover the lower surface of the pad portion and a side surface of the protrusion and to expose a lower end face of the protrusion,
    wherein a lower surface of the protective insulation layer is an exposed outside surface of the wiring substrate, and
    wherein the adhesion layer is formed to cover a first portion of a side surface of the protective insulation layer that defines the opening, and to expose a second portion of the side surface of the protective insulation layer that defines the opening.

2. The wiring substrate according to claim 1, wherein a lower end face of the adhesion layer is provided to be located at a position higher than the lower end face of the protrusion.

3. The wiring substrate according to claim 1, wherein the opening is formed so that an opening width decreases from an upper surface-side of the protective insulation layer toward a lower surface-side.

4. The wiring substrate according to claim 1, wherein the lower end face of the protrusion is provided to be located at a position higher than the lower surface of the protective insulation layer.

5. The wiring substrate according to claim 4, wherein the lower end face of the protrusion is provided to be located at a position higher than the lower surface of the protective insulation layer by a thickness of the adhesion layer.

6. The wiring substrate according to claim 1, further comprising:
    an external connection terminal connected to the lower end face of the protrusion exposed from the opening.

7. The wiring substrate according to claim 6, wherein the external connection terminal is formed to cover the second portion of the side surface of the protective insulation layer that defines opening and to cover the lower surface of the protective insulation layer located at a peripheral edge of the opening.

8. The wiring substrate according to claim 1, further comprising:

a wiring structure stacked on an upper surface of the first insulation layer and comprising a wiring layer electrically connected to the first wiring layer and an insulation layer.

9. The wiring substrate according to claim 1, wherein the protrusion has a substantially inverted conical shape where the lower end face has a diameter smaller than an upper surface.

10. The wiring substrate according to claim 1, wherein the adhesion layer is formed of titanium.

11. A semiconductor device comprising:

the wiring substrate according to claim 8; and an electronic component connected to the wiring layer, which is a top layer of the wiring structure.

* * * * *